(12) United States Patent
Zhu

(10) Patent No.: US 12,249,632 B2
(45) Date of Patent: Mar. 11, 2025

(54) SEMICONDUCTOR MEMORY DEVICE, METHOD OF MANUFACTURING THE SAME, AND ELECTRONIC DEVICE INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 72 days.

(21) Appl. No.: 18/064,449

(22) Filed: Dec. 12, 2022

(65) Prior Publication Data

US 2023/0110504 A1 Apr. 13, 2023

Related U.S. Application Data

(62) Division of application No. 16/123,016, filed on Sep. 6, 2018, now Pat. No. 11,626,498.

(30) Foreign Application Priority Data

Sep. 6, 2017 (CN) .......................... 201710800421.6

(51) Int. Cl.
*H10B 12/00* (2023.01)
*H01L 29/423* (2006.01)
(Continued)

(52) U.S. Cl.
CPC .. *H01L 29/42356* (2013.01); *H01L 29/66666* (2013.01); *H01L 29/7391* (2013.01);
(Continued)

(58) Field of Classification Search
None
See application file for complete search history.

(56) References Cited

U.S. PATENT DOCUMENTS 6,477,080 B2 11/2002 Noble
10,062,745 B2 8/2018 Ramaswamy
(Continued)

FOREIGN PATENT DOCUMENTS

CN 101425515 A 5/2009
CN 106252352 A 12/2016
(Continued)

OTHER PUBLICATIONS

U.S. Patent Office Action dated Jan. 27, 2020 for U.S. Appl. No. 16/123,016 (12 pgs).
(Continued)

*Primary Examiner* — Sarah K Salerno
(74) *Attorney, Agent, or Firm* — Christensen, Fonder, Dardi & Herbert PLLC

(57) ABSTRACT

A method of manufacturing a semiconductor memory device is provided. The method include: providing a stack of a sacrificial layer, a first source/drain layer, a channel layer, and a second source/drain layer on a substrate; defining a plurality of pillar-shaped active regions arranged in rows and columns in the first source/drain layer, the channel layer, and the second source/drain layer; removing the sacrificial layer and forming a plurality of bit lines extending below the respective columns of active regions in a space left by the removal of the sacrificial layer; forming gate stacks around peripheries of the channel layer in the respective active regions; and forming a plurality of word lines between the respective rows of active regions, wherein each of the word lines is electrically connected to the gate stacks of the respective memory cells in a corresponding one of the rows.

15 Claims, 21 Drawing Sheets

(51) Int. Cl.
  *H01L 29/66* (2006.01)
  *H01L 29/739* (2006.01)
  *H01L 29/78* (2006.01)
  *H01L 29/786* (2006.01)
  *H10B 41/10* (2023.01)
  *H10B 41/27* (2023.01)
  *H10B 41/30* (2023.01)
  *H10B 43/10* (2023.01)
  *H10B 43/27* (2023.01)
  *H10B 43/30* (2023.01)
  *H10B 51/10* (2023.01)
  *H10B 51/20* (2023.01)
  *H10B 51/30* (2023.01)
  *H01L 27/12* (2006.01)

(52) U.S. Cl.
  CPC .... *H01L 29/7827* (2013.01); *H01L 29/78642* (2013.01); *H10B 12/0335* (2023.02); *H10B 12/05* (2023.02); *H10B 12/30* (2023.02); *H10B 12/315* (2023.02); *H10B 12/482* (2023.02); *H10B 41/10* (2023.02); *H10B 41/27* (2023.02); *H10B 41/30* (2023.02); *H10B 43/10* (2023.02); *H10B 43/27* (2023.02); *H10B 43/30* (2023.02); *H10B 51/10* (2023.02); *H10B 51/20* (2023.02); *H10B 51/30* (2023.02); *H01L 27/1203* (2013.01)

(56) References Cited

U.S. PATENT DOCUMENTS

| 2007/0145464 | A1  | 6/2007 | Voshell |
| 2009/0114981 | A1* | 5/2009 | Sung ............... H10B 12/488 257/329 |
| 2010/0052029 | A1* | 3/2010 | Huang .............. H10B 12/053 257/E27.084 |
| 2010/0213525 | A1  | 8/2010 | Masuoka et al. |
| 2012/0007171 | A1  | 1/2012 | Kim et al. |
| 2013/0161710 | A1  | 6/2013 | Ji et al. |
| 2015/0079744 | A1  | 3/2015 | Hwang |

FOREIGN PATENT DOCUMENTS

| CN | 106298679 A | 1/2017 |
| CN | 106298792 A | 1/2017 |

OTHER PUBLICATIONS

U.S. Patent Office Action dated Jul. 20, 2020 for U.S. Appl. No. 16/123,016 (11 pgs.).
U.S. Patent Office Action dated Dec. 22, 2020 for U.S. Appl. No. 16/123,016 (12 pgs.).
U.S. Patent Office Action dated May 14, 2021 for U.S. Appl. No. 16/123,016 (12 pgs.).
U.S. Patent Office Action dated Jan. 10, 2022 for U.S. Appl. No. 16/123,016 (11 pgs.).
U.S. Patent Office Action dated Apr. 25, 2022 for U.S. Appl. No. 16/123,016 (11 pgs.).
Chinese Office Action dated Jun. 5, 2020 for Chinese Patent Application No. 201710800421.6 (with translation)(15 pgs.).

* cited by examiner

SEMICONDUCTOR MEMORY DEVICE, METHOD OF MANUFACTURING THE SAME, AND ELECTRONIC DEVICE INCLUDING THE SAME

CROSS-REFERENCE TO RELATED APPLICATION

This application is a divisional application of U.S. patent application Ser. No. 16/123,016 filed on Sep. 6, 2018, entitled "SEMICONDUCTOR MEMORY DEVICE, METHOD OF MANUFACTURING THE SAME, AND ELECTRONIC DEVICE INCLUDING THE SAME", which claims priority to Chinese Patent Application No. 201710800421.6, filed on Sep. 6, 2017, the content of which are incorporated herein by reference in their entireties.

TECHNICAL FIELD

The present disclosure relates to the field of semiconductors, and more particularly, to a semiconductor memory device based on vertical devices, a method of manufacturing the same, and an electronic device including the semiconductor memory device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device. A nanowire Vertical Gate-all-around Field Effect Transistor (V-GAAFET) is one of candidates for future devices with high performance.

However, for the vertical device, it is difficult to control a gate length thereof, especially for one with a single-crystalline channel material. On the other hand, if a polycrystalline channel material is used, channel resistance is greatly increased compared to the single-crystalline material. As a result, it is difficult to stack a plurality of vertical devices because this may result in excessively high resistance.

In addition, it is difficult to build a buried bit line below the vertical device having the single-crystalline channel layer.

SUMMARY

In view of the above, the present disclosure aims to provide, among others, a semiconductor memory device, a method of manufacturing the same, and an electronic device including the semiconductor memory device, which have improved characteristic(s). According to an aspect of the present disclosure, there is provided a semiconductor memory device, comprising: a substrate; an array of memory cells provided on the substrate, wherein the memory cells are arranged in rows and columns, each of the memory cells comprises a pillar-shaped active region extending vertically, wherein the pillar-shaped active region comprises source/drain regions at upper and lower ends respectively and a channel region between the source/drain regions, wherein the channel region comprises a single-crystalline semiconductor material, and wherein each of the memory cells further comprises a gate stack formed around a periphery of the channel region; a plurality of bit lines formed on the substrate, wherein each of the bit lines is located below a corresponding one of the memory cell columns, and is electrically connected to the source/drain regions at the lower ends of the respective memory cells in the corresponding column; and a plurality of word lines formed on the substrate, wherein each of the word lines is electrically connected to the gate stacks of the respective memory cells in a corresponding one of the memory cell rows.

According to another aspect of the present disclosure, there is provided a method of manufacturing a semiconductor memory device, comprising: providing a stack of a sacrificial layer, a first source/drain layer, a channel layer, and a second source/drain layer on a substrate; defining a plurality of pillar-shaped active regions arranged in rows and columns in the first source/drain layer, the channel layer, and the second source/drain layer; removing the sacrificial layer and forming a plurality of bit lines extending below the respective columns of active regions in a space left by the removal of the sacrificial layer; forming gate stacks around peripheries of the channel layer in the respective active regions; and forming a plurality of word lines between the respective rows of active regions, wherein each of the word lines is electrically connected to the gate stacks of the respective memory cells in a corresponding one of the rows.

According to yet another aspect of the present disclosure, there is provided an electronic device comprising the semiconductor memory device described above.

The semiconductor memory device according to embodiments of the present disclosure is based on vertical devices such as V-GAAFETs. The active region, particularly the channel region therein, may include a single-crystalline semiconductor material, and thus may have high mobility of carriers and low leakage current, thereby improving the device performance. In addition, the buried bit lines may be formed below the active regions. The configuration of the buried bit lines facilitates the integration of the vertical devices and thus saves the area.

According to embodiments of the present disclosure, at least one of the buried bit lines and the word lines may be formed in a self-aligned manner. This can facilitate the manufacturing and helps to save the area.

BRIEF DESCRIPTION OF THE DRAWINGS

The above and other objects, features, and advantages of the present disclosure will become more apparent from following descriptions on embodiments thereof with reference to attached drawings, in which.

Throughout the attached drawings, the same or similar reference numbers denote the same or similar elements.

DETAILED DESCRIPTION

Figure 1:
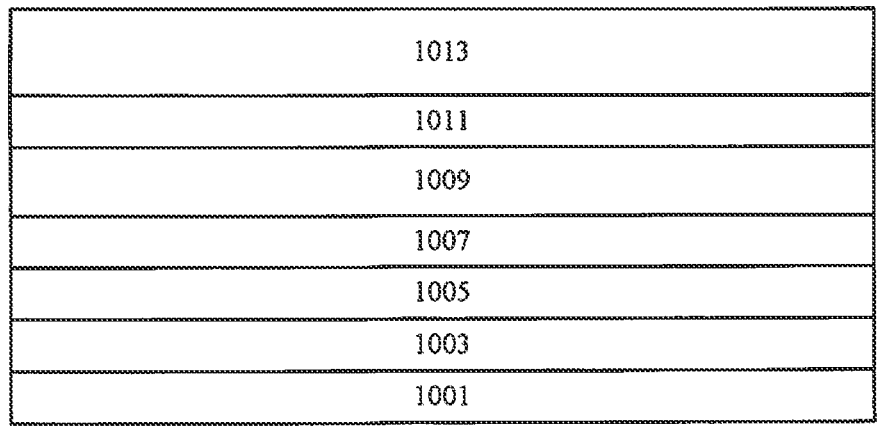
FIGS. 1-23C are schematic views showing a flow of manufacturing a semiconductor memory device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

A semiconductor memory device according to an embodiment of the present disclosure is based on vertical devices. The vertical device may include a pillar-shaped (for example, cylindrical or hexahedral, i.e., having a circular or quadrangular, such as square or rectangular sectional view) active region which extends vertically. When the active region is formed in a cylindrical shape having a small diameter, such a vertical device may constitute a V-GAAFET. The active region each may include source/drain regions at upper and lower ends respectively and a channel region between the source/drain regions.

According to an embodiment of the present disclosure, the active region may be provided by epitaxial growth. The source/drain regions and the channel region may advantageously be provided by different semiconductor layers. For example, a first source/drain layer, a channel layer, and a second source/drain layer may be grown respectively to have the lower source/drain region, the channel region, and the upper source/drain region formed therein, respectively. The respective layers may be contiguous to each other, although there may also be other semiconductor layer(s) therebetween, for example, a leakage suppression layer or an On current enhancement layer (i.e., a semiconductor layer having a band gap greater than or less that of adjacent layers). There may be a clear crystal interface between at least one pair of the adjacent layers, because they are epitaxially grown separately. In addition, the respective layers may be doped respectively so that there may be a doping concentration interface between at least one pair of the adjacent layers.

According to an embodiment of the present disclosure, the channel layer or the channel region may include a single-crystalline semiconductor material to improve the device performance. Of course, the source/drain layers or the source/drain regions may also include a single-crystalline semiconductor material. Thus, the entire active region may be made of a single-crystalline semiconductor material or single-crystalline semiconductor material(s). The single-crystalline semiconductor material of the channel layer or the channel region and the single-crystalline semiconductor material of the source/drain layers or the source/drain regions may be a cocrystal. Mobility of electrons or holes in the single-crystalline semiconductor material of the channel layer or the channel region may be greater than that of the first and second source/drain layers or the first and second source/drain regions. Further, a forbidden band gap of the first and second source/drain layers or the first and second source/drain regions may be greater than that of the single-crystalline semiconductor material of the channel layer or the channel region.

According to an embodiment of the present disclosure, the single-crystalline semiconductor material of the channel layer or the channel region may have the same crystal structure as the first and second source/drain layers or the first and second source/drain regions. In this case, a lattice constant of the first and second source/drain layers or the first and second source/drain regions if without being strained may be greater than that of the single-crystalline semiconductor material of the channel layer or the channel region if without being strained. Thus, mobility of carriers in the single-crystalline semiconductor material of the channel layer or the channel region may be greater than that in the single-crystalline semiconductor material of the channel layer or the channel region if without being strained, or an effective mass of lighter carriers in the single-crystalline semiconductor material of the channel layer or the channel region may be less than that in the single-crystalline semiconductor material of the channel layer or the channel region if without being strained, or a concentration of the lighter carriers in the single-crystalline semiconductor material of the channel layer or the channel region may be greater than that in the single-crystalline semiconductor material of the channel layer or the channel region if without being strained. Alternatively, the lattice constant of the first and second source/drain layers or the first and second source/drain regions if without being strained may be less than that of the single-crystalline semiconductor material of the channel layer or the channel region if without being strained. Thus, mobility of electrons in the single-crystalline semiconductor material of the channel layer or the channel region may be greater than that in the single-crystalline semiconductor material of the channel layer or the channel region if without being strained, or an effective mass of electrons in the single-crystalline semiconductor material of the channel layer or the channel region may be less than that in the single-crystalline semiconductor material of the channel layer or the channel region if without being strained, for example, when a <110> direction of the single-crystalline semiconductor material of the channel layer is parallel to a current density vector between the source and the drain.

The vertical device may further comprise a gate stack formed around a periphery of the active region, particularly the channel region, and may have a gate length determined by a thickness of the channel region itself, rather than the time-consuming etching as in the conventional art. As described above, the channel layer having the channel region formed therein may be formed by epitaxial growth, and thus the thickness thereof can be well controlled. Therefore, the gate length can be well controlled. The channel layer (channel region) may have its periphery inwardly recessed with respect to peripheries of the first and second source/drain layers (source/drain regions). In this way, the formed gate stack may be embedded in a recess of the channel layer with respect to the first and second source/drain layers, thereby reducing or even avoiding overlapping with the source/drain regions, which helps to reduce parasitic capacitance between the gate and the source/drain. According to an embodiment of the present disclosure, the channel layer may include a semiconductor material different from that of the first and second source/drain layers. In this way, it facilitates processing the channel layer by, for example, selective etching, so that the channel layer is recessed with respect to the first and second source/drain layers. In addition, the first and second source/drain layers may include the same semiconductor material.

According to an embodiment of the present disclosure, the vertical device may be a conventional Field Effect Transistor (FET). In a case of the conventional FET, the source and drain regions may have the same conductivity type of doping (for example, n-type doping or p-type doping). A conduction channel may be formed by the channel region between the source and drain regions at the opposite ends of the channel region. Alternatively, such a semiconductor device may be a tunneling FET. In a case of the tunneling FET, the source and drain regions on the opposite sides of the channel region may have different conductivity types of doping (for example, n-type doping and p-type doping respectively). In this case, charged particles such as electrons may tunnel from the source region into the drain region through the channel region, thereby forming a conduction path between the source and drain regions. Although the conventional FET and the tunneling FET have different conduction mechanisms, they both exhibit such an electrical property that the gate controls whether there is a conduction or not between the source and drain regions. Therefore, for both the conventional FET and the tunneling FET, descriptions are made by collectively using the terms "source/drain layer (source/drain region)" and "channel layer (channel region)", although there is no common "channel" in the tunneling FET.

Such a vertical device may act as a switch device in a memory cell, and the memory cell may further include a storage element (for example, a capacitor) connected to the switch device (resulting in, for example, a 1T1C configuration). Alternatively, the memory cell may be entirely based on the vertical device. For example, the gate stack may include a storage configuration such as a floating gate configuration or a charge trapping layer or a ferro-electric material or the like. Those skilled in the art can conceive of other memory cell configurations. Such memory cells may be arranged in an array in rows and columns. The memory cells based on vertical devices are relatively easy for three dimension (3D) integration. In particular, planar arrays of memory cells may be stacked in multiple layers so as to form a 3D array of memory cells. Those memory cells may constitute a Dynamic Random Access Memory (DRAM).

According to an embodiment of the present disclosure, bit lines may be buried below the active regions, more specifically, below the lower source/drain regions. For example, each of the bit lines may extend along a direction of a corresponding one of the memory cell columns to be aligned with the lower source/drain regions of the respective memory cells in the corresponding column. This configuration facilitates electrical connection of the bit line to the lower source/drain regions of the memory cells. For example, the memory cells may have their respective active regions directly stacked on the corresponding bit line, and thus the lower source/drain regions thereof are in direct contact with the bit line (or via an ohmic contact layer of, for example, metal silicide) and therefore electrically connected to the bit line. This configuration of the buried bit lines facilitates the integration of the memory cells.

According to an embodiment of the present disclosure, the bit lines may be formed based at least partly on a self-alignment technique. For example, a portion (herein, referred to as "a first portion") of a bit line which overlaps with a corresponding memory cell may have at least a part of a periphery thereof defined in shape by a periphery of the corresponding memory cell, particularly, an active region thereof. This part of the periphery is formed by using the shape of the periphery of the corresponding memory cell as a mask, and is thus "self-aligned." That is, the first portion is located directly below and substantially center-aligned to the corresponding memory cell. The self-aligned bit line facilitates electrical contact between the bit line and the lower source/drain regions, and occupies no extra area because the bit line is aligned under the memory cells.

The bit line may also include second portions which extend between the respective first portions. For the convenience of patterning, the second portions may be in a (straight) strip shape. A part of the peripheries of the first portions is in the same shape (for example, a circular shape in a case of cylindrical active regions) as that of the peripheries of the corresponding memory cells as described above. Therefore, the bit line according to the embodiment of the present disclosure may have a variable thickness, unlike a bit line with a substantially uniform thickness in the conventional art. For example, the first portions of the bit line may be thicker than second portions of the bit line (here, the "thickness" may refer to a dimension perpendicular to a longitudinal direction thereof, and may also be referred to as a line width).

More specifically, the second portions of the bit line each may include a first sidewall and a second sidewall which extend substantially along a direction of the column and oppose each other, and the first portions of the bit line each may include a third sidewall connecting the first sidewalls of the second portions adjacent thereto and a fourth sidewall connecting the second sidewalls of the second portions adjacent thereto. At least one of the third sidewall and the fourth sidewall may be formed by a self-alignment technique, and thus may protrude with respect to a corresponding one of the first or second sidewall in a direction perpendicular to the column. Due to the self-alignment, at least one of the third sidewall and the fourth sidewall is substantially conformally formed with respect to a periphery of the active region of the corresponding memory cell, so that a pattern with a substantially uniform thickness is defined in a top view by the at least one of the third sidewall and the fourth sidewall and the periphery of the active region of the corresponding memory cell, or the at least one of the third sidewall and the fourth sidewall may even substantially coincide with the periphery of the active region of the corresponding memory cell in the top view.

According to an embodiment of the present disclosure, word lines may also be formed in a self-aligned manner. More specifically, each of the word lines may extend between the respective rows of memory cells. Thus, the word lines may occupy no extra area. The gate stacks may include respective extension portions extending towards the corresponding word lines. The word lines may extend downwards to contact the respective gate stacks, so as to be electrically connected to the respective gate stacks.

Such a semiconductor memory device may be manufactured, for example, as follows. Unlike in the conventional art, a bit line layer is not firstly formed on the substrate because it is difficult to provide a channel region or a channel layer of a single-crystalline material on the bit line layer of a conductive material (for example, metal). For this, according to an embodiment of the present disclosure, a stack of a sacrificial layer, a first source/drain layer, a channel layer, and a second source/drain layer may be provided on the substrate. For example, the stack may be provided by epitaxial growth. Thus, the channel layer may be formed of a single-crystalline material (of course, the source/drain layers may also be formed of a single-crystalline material).

For the stacked first source/drain layer, channel layer, and second source/drain layer, active regions may be defined therein. For example, they may be selectively etched in sequence into a desired shape. In general, the active regions may be in a pillar (for example, cylindrical) shape. In order to form the array of memory cells, an array of pillar-shaped active regions arranged in rows and columns may be defined.

The underlying sacrificial layer is exposed between the active regions. Thus, the sacrificial layer may be replaced with bit lines extending below the respective columns of active regions. For example, the sacrificial layer may be removed, a conductive material may be filled in a space left by the removal of the sacrificial layer, and the conductive material may be patterned into a plurality of bit lines. In this way, buried bit lines may be formed.

Since the first source/drain layer is suspended due to the removal of the sacrificial layer, a hold layer may be provided to keep the first source/drain layer, the channel layer, and the second source/drain layer to prevent them from collapsing during the manufacturing process. This hold layer needs to be connected to the substrate through the sacrificial layer to achieve the hold function. That is, before the sacrificial layer is replaced, it needs to form cuts through the sacrificial layer so that the subsequently formed hold layer may be connected to the substrate through the cuts.

To do this, every two adjacent columns of active regions may be taken as a group, and the sacrificial layer may be cut off at positions between the two columns in the respective groups to form a series of cuts in the sacrificial layer (hereinafter referred to as "first cuts".) A hold layer (of a dielectric material) may then be formed on the substrate, fills gaps in the stack (including the first cuts in the sacrificial layer), and thus is connected to the substrate through the first cuts in the sacrificial layer. The hold layer may be patterned to expose the sacrificial layer between the respective groups so as to process the sacrificial layer. Thus, the sacrificial layer may be selectively etched through the exposed portions of the sacrificial layer to remove the sacrificial layer. A conductive material may be filled in the space left by the removal of the sacrificial layer. The conductive material may be patterned into bit lines which extend in a direction of the active region columns. In order to simplify the manufacturing and avoid more masks, the conductive material may be selectively etched by using the hold layer as a mask to cut off the conductive material so as to form the bit lines.

In addition, the hold layer is present both during the removing of the sacrificial layer and during the filling of the conductive material. Thus, some of boundaries of the filled conductive material are defined by the hold layer. In order to simplify the manufacturing and avoid more masks, those boundaries may constitute boundaries of the bit lines so that those boundaries need not to be considered when the conductive material is subsequently patterned.

That is, the first cuts which are formed in the sacrificial layer when the sacrificial layer is cut off may define boundaries of the respective bit lines on one side (hereinafter referred to as "a first boundary defining operation"), and the hold layer may define boundaries of the respective bit lines on the other side (hereinafter referred to as "a second boundary defining operation") when the conductive material is patterned using the hold layer as a mask. At least one of the first boundary defining operation and the second boundary defining operation may be performed in a self-aligned manner.

For example, the first boundary defining operation may be performed in a self-aligned manner. In this case, in the operation of cutting off the sacrificial layer, a mask layer may be formed on the stack, and includes a plurality of first openings, each of which extends in a direction of the column to expose a position between the two columns in a corresponding one of the active region groups, and exposes parts of peripheries of the respective active regions in each of the two columns in the corresponding group which face the other column in the group. Due to the exposure of the parts of the peripheries of the active regions, when the sacrificial layer is being selectively etched, the exposed parts of the peripheries of the active regions, together with the mask layer, may define the shape of the first cuts in the sacrificial layer. Accordingly, the boundaries of the bit lines defined by the cuts may be defined by the peripheries of the active regions.

In addition, the mask layer may further comprise a plurality of second openings, each of which exposes a position between the respective groups. For example, the mask layer may include strip patterns extending over the respective columns of active regions, an each of the strip patterns exposes parts of peripheries of the respective active regions in the corresponding column on opposite sides. Cuts (referred to as "second cuts") may be provided in the sacrificial layer by the second openings of the mask layer for replacing the sacrificial layer later. As described above, the subsequently formed hold layer is patterned to expose positions between the respective groups, particularly positions where the second cuts are located. Then, portions of the hold layer at the second cuts may be removed (and portions of the hold layer at the first cuts are left), so that the sacrificial layer is exposed for being replaced.

Similarly, the second boundary defining operation may be performed in a self-aligned manner. In this case, the hold layer may be patterned to further expose parts of the peripheries of the respective active regions in each of the groups which face an adjacent one of the groups. Due to the exposure of the parts of the peripheries of the active regions, when the conductive material is being patterned, the exposed parts of the peripheries of the active regions, together with the hold layer, may define the boundaries of the bit lines on the other side.

After the bit lines are formed, gate stacks may be formed around the peripheries of the channel layer in the respective active regions. For example, the periphery of the channel layer may be recessed inwardly with respect to the peripheries of the first and second source/drain layers so as to define a space for accommodating the gate stacks. For example, this may be done by selective etching. In this case, the gate stacks may be embedded in the recess, and each may include a portion extending outwards from the recess so as to be electrically connected to a corresponding one of the word lines. The word lines may be formed between the respective rows of active regions, and each are electrically connected to the gate stacks of the respective memory cells in the corresponding row.

In a case that storage elements such as capacitors are additionally formed, a dielectric layer may be formed to cover the stack and the word lines, and storage elements electrically connected to the respective second source/drain layers in the respective active regions may be formed on the dielectric layer.

In order to provide electrical isolation, an insulating layer may be formed below the bit lines. Similarly to the formation of the bit lines, such an insulating layer may also be achieved by replacement of a sacrificial layer. For example, another sacrificial layer may be formed on the substrate, and the stack is provided on the other sacrificial layer. After the active regions are defined and before the sacrificial layer is replaced, the other sacrificial layer may be removed and the insulating layer may be formed in a space left by the removal of the other sacrificial layer.

The replacement operation of the other sacrificial layer may be incorporated in the replacement operation of the sacrificial layer described above. For this, in the operation of cutting off the sacrificial layer, the other sacrificial layer may also be selectively etched. Thus, the same cuts as those in the sacrificial layer (for example, the first cuts and optionally the second cuts described above) may be formed in the other sacrificial layer. As described above, the subsequently formed hold layer is patterned to expose the positions between the respective groups, particularly the positions where the second cuts are located. Then, the portions of the hold layer at the second cuts may be removed (and the portions of the hold layer at the first cuts are left), so that the sacrificial layer and the other sacrificial layer are exposed. Thus, the other sacrificial layer may be selectively etched to remove the other sacrificial layer, and the insulating material may be filled in a space left by the removal of the other sacrificial layer.

The technology of the present disclosure can be implemented in various ways, some of which are exemplified in the following with reference to the drawings.

FIGS. 1-23B are schematic views showing a flow of manufacturing a semiconductor memory device according to an embodiment of the present disclosure.

As shown in FIG. 1, a substrate 1001 is provided. The substrate 1001 may be a substrate in any form, for example, but not limited to, a bulk semiconductor material substrate such as a bulk silicon (Si) substrate, a Semiconductor On Insulator (SOI) substrate, a compound semiconductor substrate such as an SiGe substrate, or the like. Hereinafter, the bulk Si substrate will be described by way of example for the convenience of description.

On the substrate 1001, a first sacrificial layer 1003, a second sacrificial layer 1005, a first source/drain layer 1007, a channel layer 1009, and a second source/drain layer 1011 may be formed in sequence by, for example, epitaxial growth. For the convenience of etching as described below, etching selectivity may be provided between adjacent ones of the layers by, for example, making the adjacent layers from different semiconductor materials. For example, the first sacrificial layer 1003 may include SiGe (with an atomic percentage of Ge being about 10-35%) with a thickness of about 10-40 nm; the second sacrificial layer 1005 may include Si with a thickness of about 10-100 nm; the first source/drain layer 1007 may include SiGe (with an atomic percentage of Ge being about 10-35%) with a thickness of about 20-40 nm; the channel layer 1009 may include Si with a thickness of about 10-50 nm; and the second source/drain layer 1011 may include SiGe (with an atomic percentage of Ge being about 10-35%) with a thickness of about 20-40 nm.

The first source/drain layer 1007 and the second source/drain layer 1011 may be in-situ doped while being grown. For example, for an n-type device, n-type doping may be performed on the first source/drain layer 1007 and the second source/drain layer 1011 with a doping concentration of about 1E17-1E20 cm$^{-3}$; and for a p-type device, p-type doping may be performed on the first source/drain layer 1007 and the second source/drain layer 1011 with a doping concentration of about 1E17-1E20 cm$^{-3}$. In addition, the channel layer 1009 may also be doped in-situ to adjust a threshold voltage (Vt) of the device. For example, for an n-type device, p-type doping may be performed on the channel layer 1009 with a doping concentration of about 1E15-2E18 cm$^{-3}$; and for a p-type device, n-type doping may be performed on the channel layer 1009 with a doping concentration of about 1E15-2E18 cm$^{-3}$.

In addition, for a junctionless device, the same type of doping may be performed on the first source/drain layer 1007, the channel layer 1009, and the second source/drain layer 1011. For a tunneling device, different types of doping may be performed on the first source/drain layer 1007 and the second source/drain layer 1011. For example, p-type doping may be performed on the first source/drain layer 1007 and n-type doping may be performed on the second source/drain layer 1011, or vice versa.

A hard mask layer 1013 may be provided above the stack of the semiconductor layers. The hard mask layer 1013 may then serve as an (etching or planarization) stop layer, to protect the underlying semiconductor layers, or the like. For example, the hard mask layer 1013 may include nitride (for example, silicon nitride) with a thickness of about 20-150 nm.

Next, active regions may be defined. Here, in order to form an array of memory cells, an array of active regions may be formed. For example, this can be done as follow.

Figure 2:
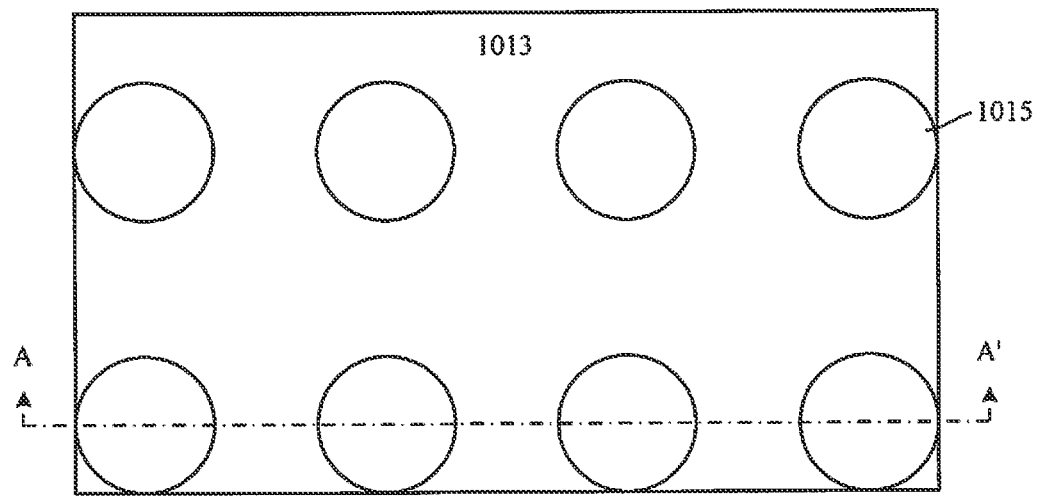

As shown in the top view of FIG. 2, photoresist 1015 may be formed on the hard mask layer 1013 and may be patterned by photolithography (exposure and development) into a shape of the array of active regions to be formed. In this example, the photoresist 1015 is patterned into an array of circular regions arranged in rows and columns. Of course, other shapes are also feasible, such as rectangular, square, ellipse, or the like.

Figure 3:
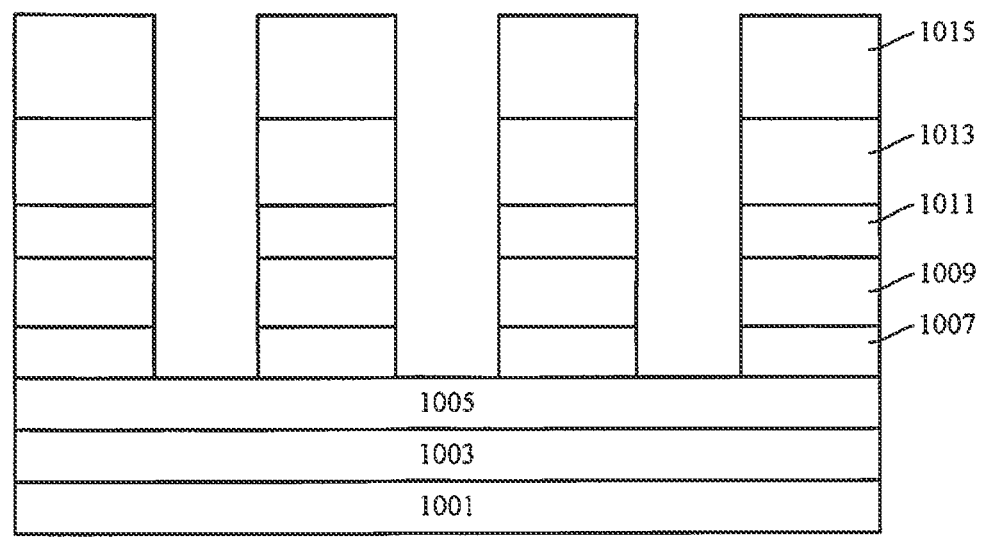
Figure 4:
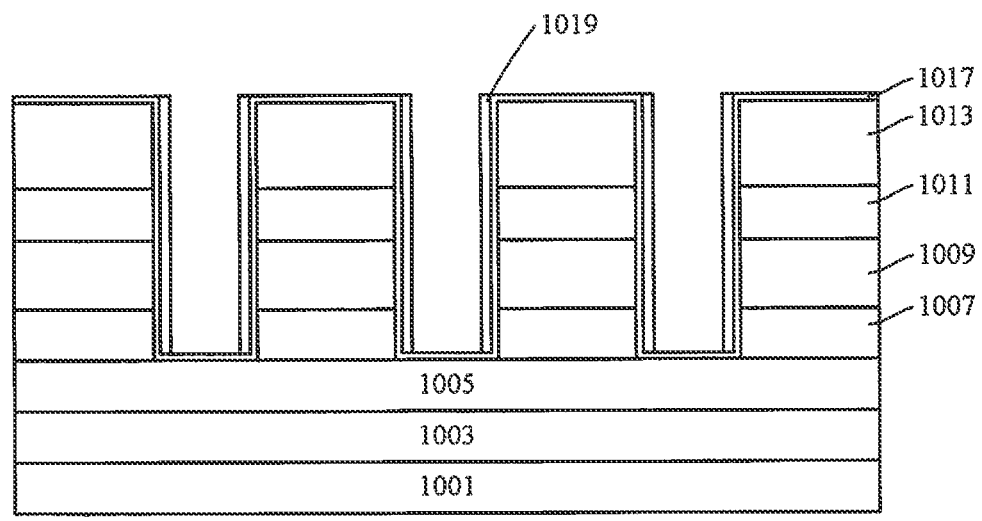

Subsequently, as shown in FIG. 3 (FIG. 3 is a sectional view taken along line AA' in FIG. 2), the hard mask layer 1013, the second source/drain layer 1011, the channel layer 1009, and the first source/drain layer 1007 may be selectively etched by, for example, Reactive Ion Etching (RIE) in sequence using the patterned photoresist 1015 as a mask. Etching may be stopped at the second sacrificial layer 1005. Then, after the etching, the second source/drain layer 1011, the channel layer 1009, and the first source/drain layer 1007 form pillar-shaped (in this example, cylindrical) active regions. The active regions are arranged in an array as shown in FIG. 2 in the top view. The RIE may be performed, for example, in a direction substantially perpendicular to the substrate surface so that the pillar-shaped active regions are also substantially perpendicular to the substrate surface. After that, the photoresist 1015 may be removed.

In order to protect the active regions, particularly exposed sidewalls thereof, a protection layer 1019 may be formed on the sidewalls. For example, such a protection layer 1019 may be formed by formation of a spacer. For example, the protection layer 1019 may include nitride. Before the nitride protection layer 1019 is formed, a thin oxide layer 1017 (for example, silicon oxide, with a thickness of about 2-5 nm) may also be deposited, and may serve as an etching stop layer. For example, an oxide layer and a nitride layer may be deposited in a substantially conformal manner on the structure shown in FIG. 3 (with the photoresist 1015 removed), and the nitride layer may then be selectively etched by, for example, RIE in a direction substantially perpendicular to the substrate surface, to remove a lateral extension portion thereof and leave a vertical extension portion thereof, thereby forming the protection layer 1019. The RIE of the nitride layer may be stopped at the oxide layer 1017.

After the array of active regions is formed, the first sacrificial layer and the second sacrificial layer may be processed to be replaced with an insulating layer and a bit line layer, respectively. To do this, paths to the first sacrificial layer and the second sacrificial layer need to be opened on the one hand, and a hold layer needs to be provided on the other hand, so as to keep the array of active regions (to prevent them from collapsing) during the replacement process.

As described above, for the convenience of patterning, when the paths are opened in the sacrificial layers, boundaries of bit lines on one side may be defined. As the bit lines extend along a column direction of the array, such paths may also extend along the column direction. In addition, the same hold layer may be shared between two adjacent columns. Then, every two adjacent columns may be taken as a group. A hold layer may be formed between two columns in each group so that the hold layer may keep the two columns. Therefore, a mask layer may be provided to expose a position between the two columns in each group.

Figure 5A:
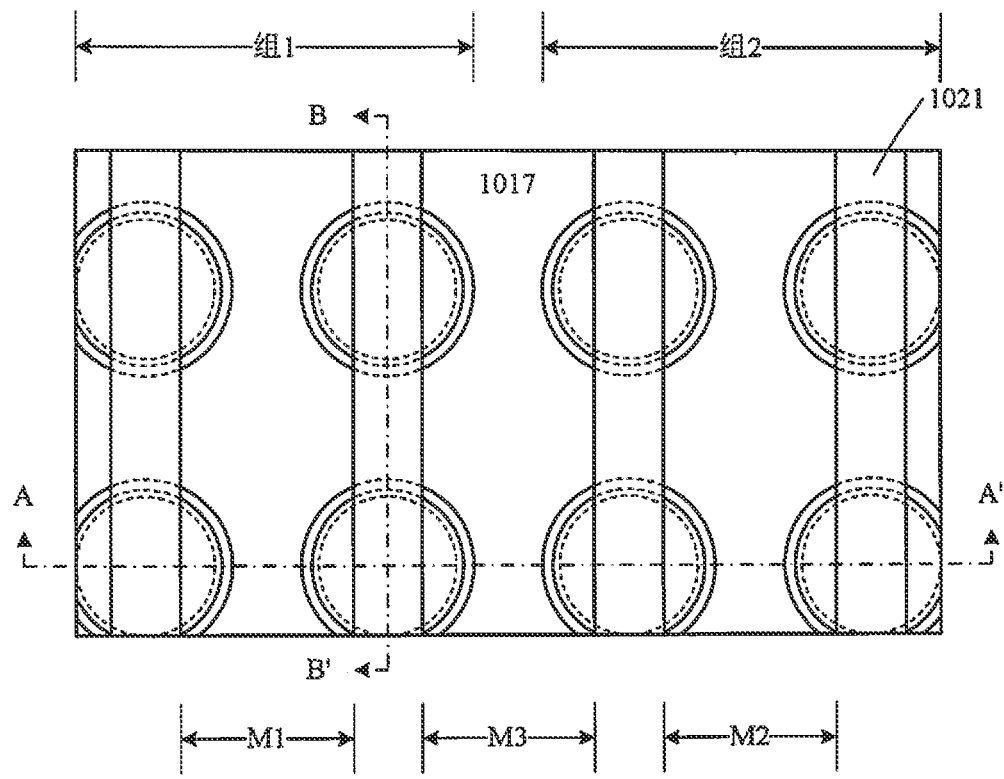
Figure 5B:
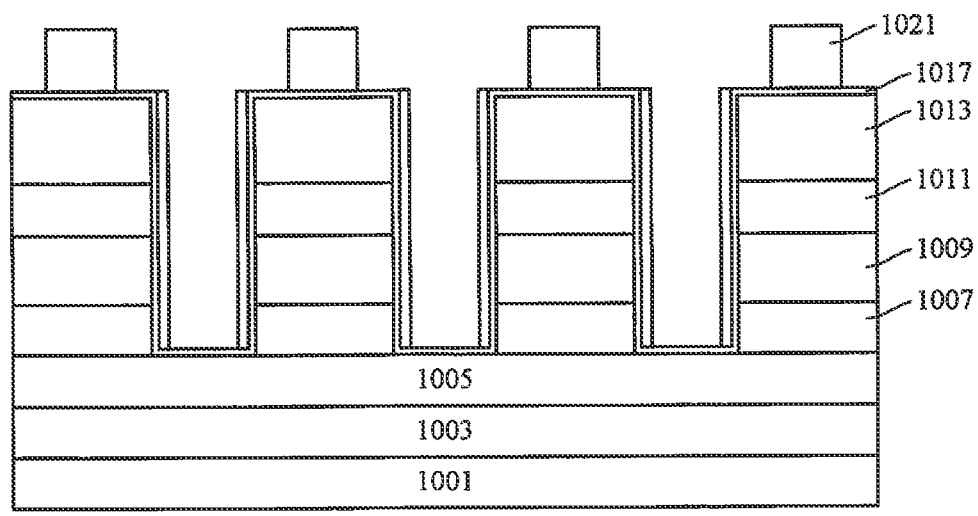
Figure 5C:
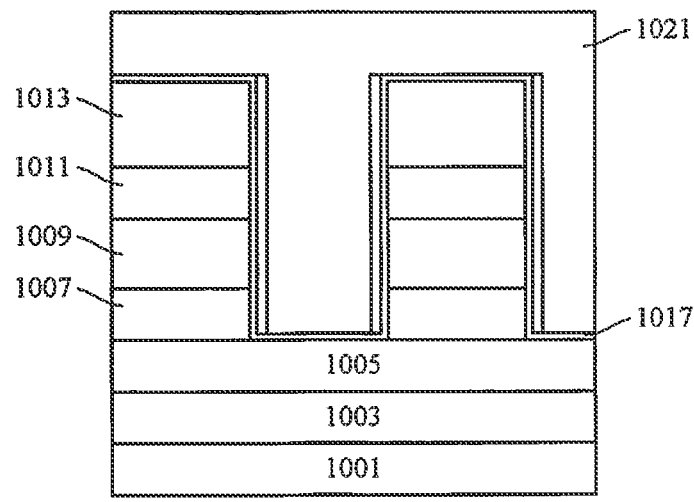

In an example shown in FIGS. 5A, 5B and 5C (FIG. 5A is a top view, FIG. 5B is a sectional view taken along line AA' in FIG. 5A, and FIG. 5C is a sectional view taken along line BB' in FIG. 5A), two columns on the left belong to one group (group 1) and two columns on the right belong to another group (group 2). The formed mask layer 1021 (for example, photoresist) may be patterned (by, for example, photolithography) to expose a position between two columns in each group, for example, position M1 between the two columns in the group 1 and position M2 between the two columns in the group 2. Here, as described above, parts of peripheries of the active regions are further exposed by the mask layer 1021 at the positions M1 and M2 for the purpose of self-alignment. Then, in a subsequent patterning or etching process, the active regions may serve as a mask together with the mask layer 1021.

In addition, in the example of FIGS. 5A, 5B and 5C, not only the position between two columns in each group but also positions between the respective groups, for example, a position M3 between the group 1 and the group 2, are exposed by the mask layer 1021. As described below, this is to, for example, provide openings in the sacrificial layers in the same etching step. Similarly, parts of the peripheries of the active regions may also be exposed by the mask layer 1021 at the position M3.

Then, in this example, the mask layer 1021 comprises strip patterns extending over the respective columns of active regions, and each expose, on opposite sides thereof, parts of peripheries of the active regions in a corresponding column.

It is to be noted here that the first sacrificial layer is not necessary. The first sacrificial layer serves to keep the position for an insulating layer and is subsequently replaced with the insulating layer. However, this insulating layer is not necessary. For example, in a case of an SOI substrate, a buried oxide layer of the SOI substrate may act as such an insulating layer, and an SOI layer of the SOI substrate may act as the second sacrificial layer. In addition, it is not necessary to expose the position M3 between the respective groups (that is, the position M3 may be covered by the mask layer 1021.)

Figure 6:
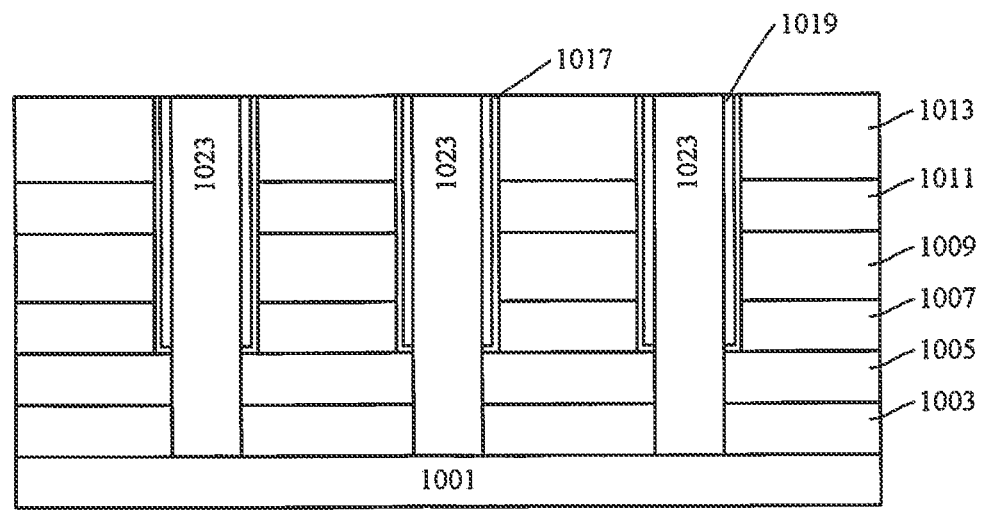

After that, as shown in FIG. 6 (FIG. 6 is a sectional view taken along line AA' in FIG. 5A), the oxide layer 1017, the second sacrificial layer 1005, and the first sacrificial layer 1003 are selectively etched, by for example, RIE, in sequence (for example, in a direction substantially perpendicular to the substrate surface) using the mask layer 1021 and the active regions (actually the hard mask layer 1013 on the top of the active regions) as a mask. The RIE may be stopped at the substrate 1001 to form cuts in the first sacrificial layer 1003 and the second sacrificial layer 1005 (a cut corresponding to the position between the two columns in each group such as M1 and M2 may be referred to as a "first cut", and a cut corresponding to the position between the groups such as M3 may be referred to as a "second cut"). Then, peripheries of parts of such a cut corresponding to the respective active regions may have their shapes defined by those of the peripheries of the respective active regions (due to the presence of the oxide layer 1017 and the protection layer 1019, the peripheries of those parts of the cut are recessed to a certain extent with respect to the peripheries of the respective active regions, wherein the extent of the recession is substantially uniform along the peripheries of the respective parts of the cut; or the peripheries of those parts of the cut may substantially coincide with those of the respective active regions in the top view if without the oxide layer 1017 and the protection layer 1019 being provided).

Then, a dielectric material may be filled in gaps of the stack to form a hold layer 1023. For example, oxide may be deposited and planarized by, for example, Chemical Mechanical Polishing (CMP). The CMP may be stopped at the hard mask layer 1013.

It can be seen that the respective active regions are surrounded by the hold layer 1023 which is connected to the substrate 1001. Then, the active regions may be kept in subsequent processes to be prevented from collapsing.

Then, processing paths to the sacrificial layers may further be opened in the hold layer 1023. As described above, boundaries of the bit lines on one side are defined at the position (M1 or M2) between the two columns in each group, and thus the hold layer 1023 may be removed from the position (M3) between the respective groups.

Figure 7A:
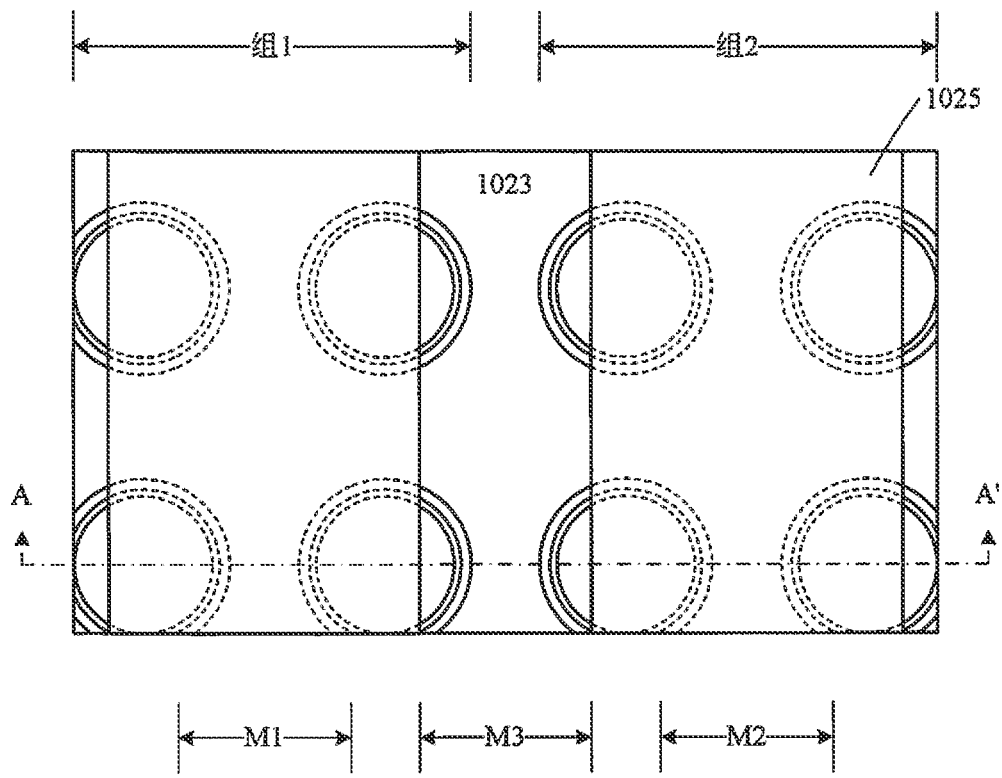
Figure 7B:
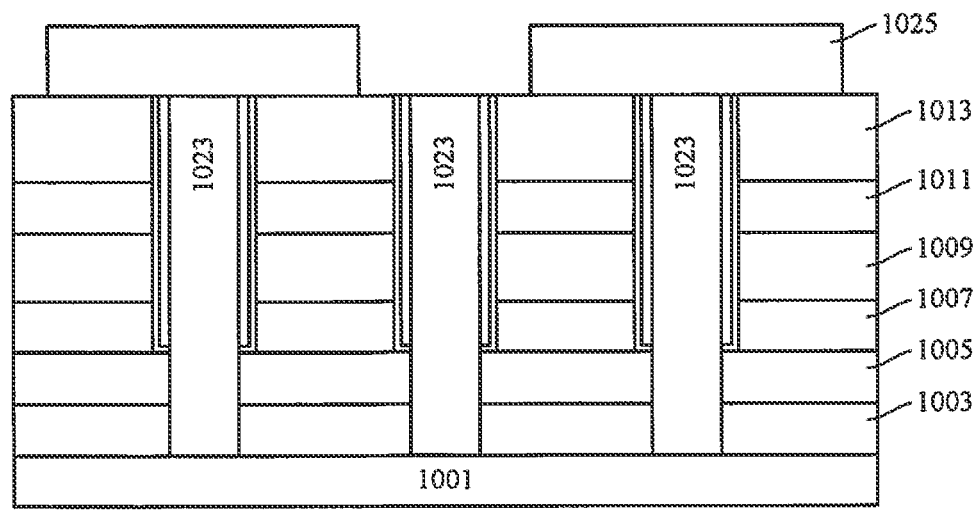

As shown in FIGS. 7A and 7B (FIG. 7A is a top view, and FIG. 7B is a sectional view along line AA' in FIG. 7A), a mask layer 1025 (for example, photoresist) may be provided and patterned (by, for example, photolithography) to expose the position (M3) between the respective groups, particularly the second cuts described above. Here, it may be better to provide the mask layer 1025 to completely expose the positions where the second cuts are, so that portions of the hold layer in the second cuts may be completely removed later to completely expose the second cuts.

In addition, as described below, the mask layer 1025 will define boundaries of the hold layer 1023, which in turn define boundaries of the bit lines on the other side. As described above, for the purpose of self-alignment, parts of the peripheries of the active regions may be exposed by the mask layer 1025 at the position (M3) between every two groups.

Figure 8:
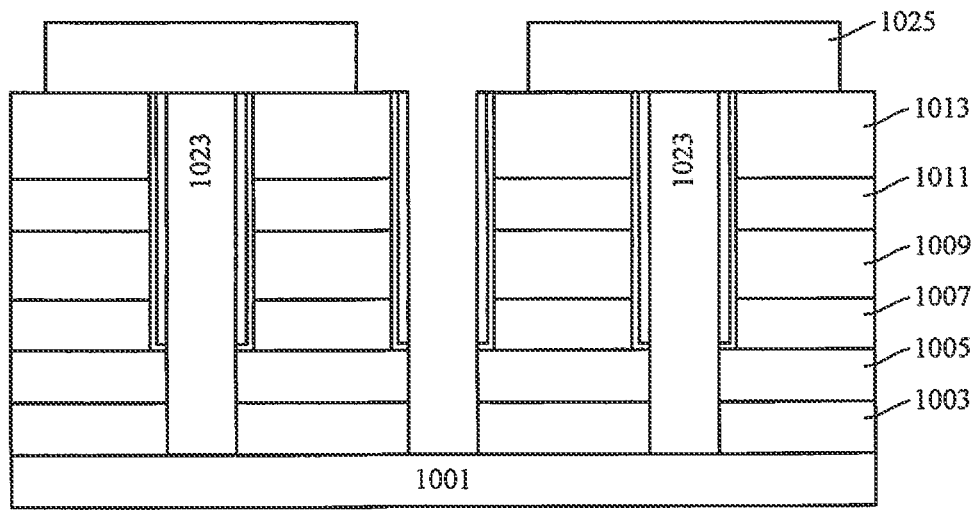

Then, as shown in FIG. 8 (FIG. 8 is a sectional view taken along line AA' in FIG. 7A), the hold layer 1023 may be selectively etched by, for example, RIE (for example, in a direction substantially perpendicular to the substrate surface) using the mask layer 1025 as a mask. The RIE may be stopped at the substrate 1001, so that the hold layer 1023 is removed from the positions (M3) between the respective groups. Particularly, the positions of the second cuts are (completely) exposed, so as to expose the sidewalls of the first sacrificial layer 1003 and the second sacrificial layer 1005. Then, the mask layer 1025 may be removed.

If the operations described above in connection with FIGS. 5A, 5B, 5C and 6 do not cut off the sacrificial layers at the positions (M3) between the respective groups (i.e. the second cuts are not formed), that is, only the position (M1 or M2) between the two columns in each group is exposed by the mask layer 1021, while the positions (M3) between the respective groups are covered by the mask layer 1021, then after the hold layer 1021 is processed by RIE, the sacrificial layers also need to be selectively etched by, for example, RIE using the mask layer 1025 (and the active regions or the hard mask layer 1031) as a mask, to form the second openings therein, so as to expose the sidewalls of the sacrificial layers for the convenience of replacement of the sacrificial layers. However, it is advantageous to form the second openings and the first openings at the same time because substantially the same etching recipe (mainly a downward etching recipe) can be used. Different etching recipes (mainly a lateral etching recipe) may be used when the sacrificial layers are removed below.

Then, a replacement process of the sacrificial layers may be performed.

Figure 9:
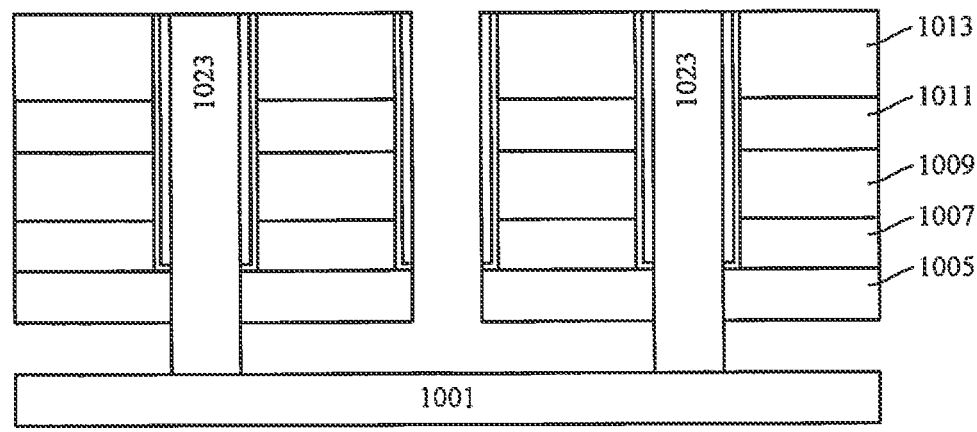

As shown in FIG. 9, the first sacrificial layer 1003 may be selectively etched to be removed. Then, a space is left below the second sacrificial layer 1005. Due to the presence of the hold layer 1023, the second sacrificial layer 1005 and the active regions can be supported.

Figure 10:
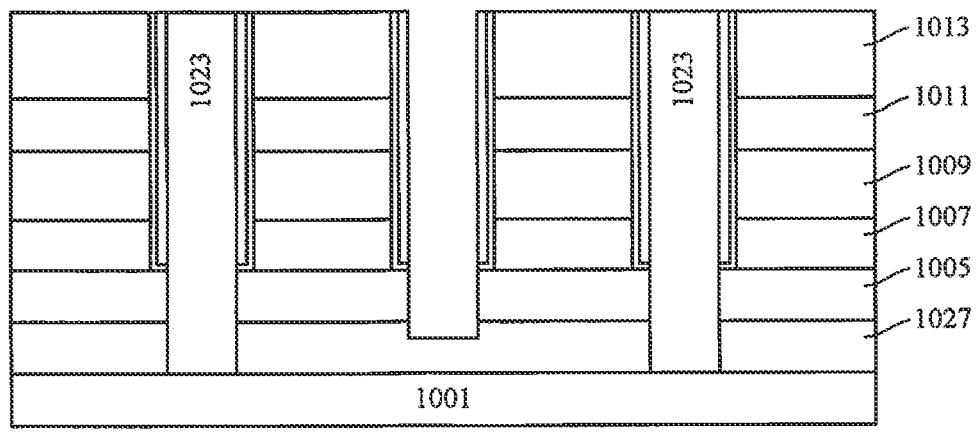

Then, as shown in FIG. 10, the space left by the removal of the second sacrificial layer 1003 may be filled with the insulating layer 1027 by, for example, deposition. For example, oxynitride may be deposited into the stack via the gaps (M3) in the hold layer 1023, and the deposited oxynitride may be etched back by selective etching such as RIE to form the insulating layer 1027. Here, at the second cuts (M3), a top surface of the insulating layer 1027 after the etching back does not go beyond a bottom surface of the second sacrificial layer 1005 so as to expose the sidewalls of the second sacrificial layer 1005. Of course, it is better not to remove the insulating layer 1027 completely here, and some of the insulating layer 1027 with a certain thickness of, for example, about 20-30 nm may be left to ensure electrical insulation.

Figure 11:
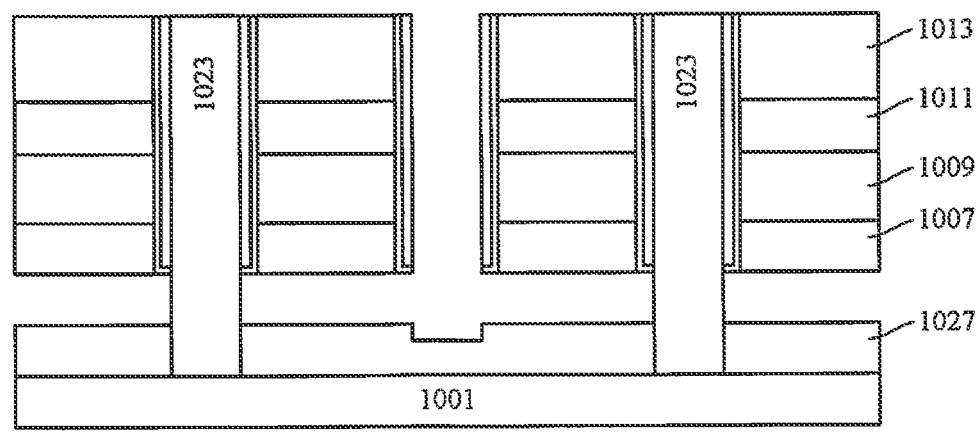

Then, the second sacrificial layer 1005 may be replaced in a similar manner. For example, as shown in FIG. 11, the second sacrificial layer 1005 may be selectively etched to be removed. Then, a space is left at a location where the second sacrificial layer 1005 is originally located. Due to the presence of the hold layer 1023, the active regions can be supported.

Figure 12A:
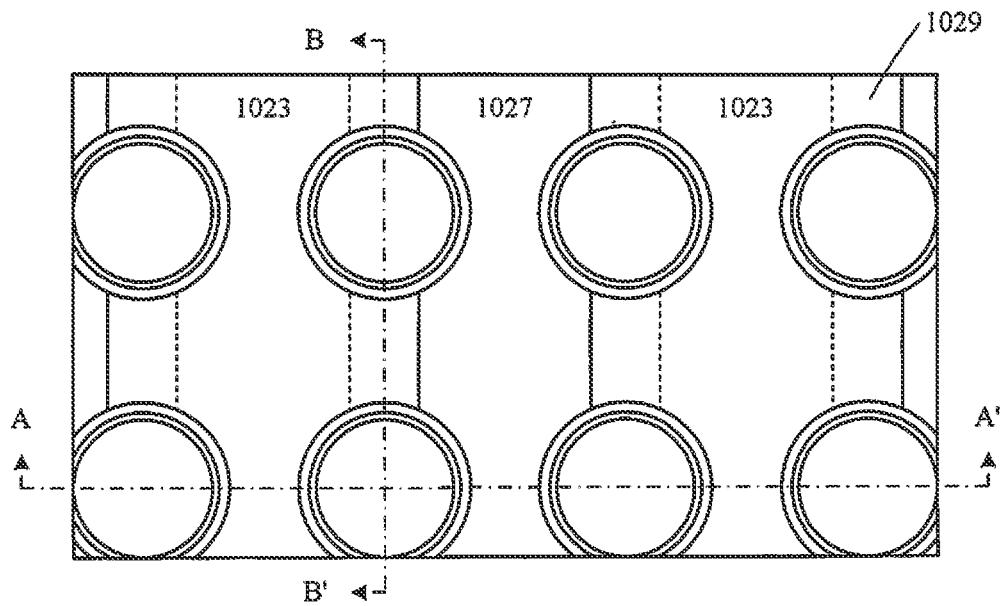
Figure 12B:
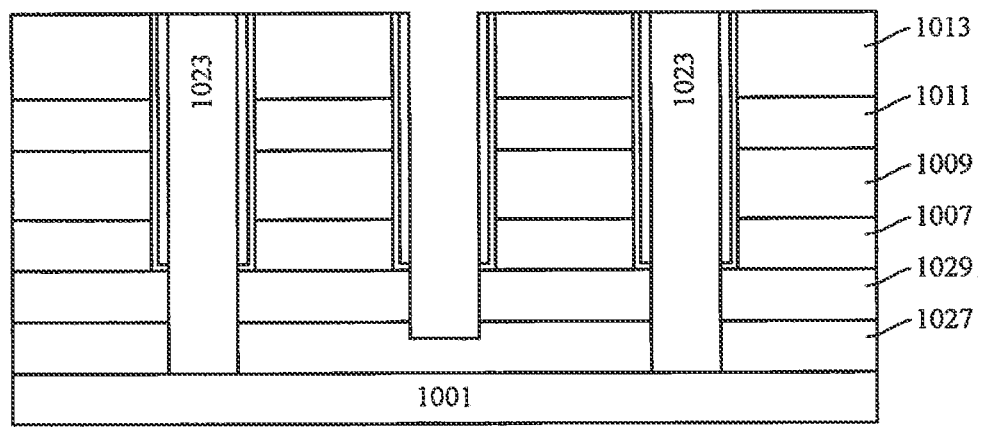
Figure 12C:
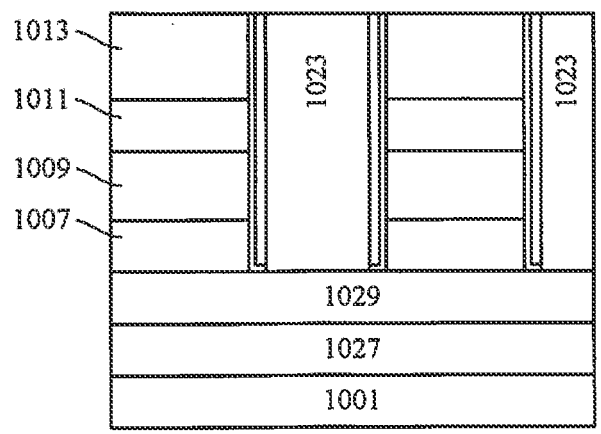

Next, as shown in FIGS. 12A, 12B and 12C (FIG. 12A is a top view, FIG. 12B is a sectional view taken along line AA' in FIG. 12A, and FIG. 12B is a sectional view taken along line BB' in FIG. 12A), bit lines 1029 may be formed in the space left by the removal of the first sacrificial layer 1005. For example, a conductive material, for example, metal such as tungsten (W) or the like, may be deposited into the stack via the gaps (M3) in the hold layer 1023, and the deposited conductive material may be etched back by selective etching such as RIE to form the bit lines 1029. In order to prevent diffusion, a thin diffusion barrier layer such as TiN may be deposited before the metal is deposited. The etching back of the conductive material may be stopped at, for example, the underlying insulating layer 1027, and thus the conductive material is completely cut off at the gaps (M3) in the hold layer 1023 so that the conductive material is separated into individual bit lines 1029.

As shown in the top view of FIG. 12A, the bit line 1029 extends along each of the columns of active regions below the column. At a position where the bit line 1029 overlaps with a respective one of the active regions, the bit line 1029 has substantially the same shape as that of the active region (in this example, a circular shape; and a diameter thereof is slightly larger due to the presence of the protection layer), and remaining portions of the bit line 1029 extend between the respective circular portions. Thereby, as shown in the sectional view of FIG. 12C, the bit lines 1029 extend continuously below the respective columns. Each of the bit lines 1029 has its boundary at the position (M1 or M2) between the two columns in a corresponding group defined by a boundary of the first cut, and its boundary at the position (M3) between the groups defined by a boundary of the hold layer 1023. In this example, the boundaries of the bit line 1029 on opposite sides thereof are self-aligned with corresponding active regions. However, the present disclosure is not limited thereto. For example, only one boundary on one side may be self-aligned with the active regions (since, as described above, the boundaries on the opposite sides are defined in different etching operations respectively), while the other boundary on the other side may be varied in order to adjust resistance of the bit lines.

In this example, at a position where the bit line 1029 overlaps with an active region, the circular shape of the bit line 1029 is substantially concentric with the circular shape of the active region in the top view. Of course, the shape of this portion of the bit line 1029 is defined by the shape of the active region and thus can change with the shape of the active region. It can be seen from the above processes that the boundary of this portion of the bit line 1029 may be formed substantially conformally with respect to the boundary of the active region, so that they can define a pattern with a substantially uniform thickness in the top view.

Thus, the bit lines buried below the active regions are formed.

In order to reduce the contact resistance, a silicide layer may be formed at a bottom surface of the first source/drain layer 1007 before the bit lines 1029 are formed. For example, a metal layer such as Ni or NiPt may be formed by deposition in the space left by the removal of the second sacrificial layer 1005, and may be annealed at a temperature of, for example, about 200-500° C., so that this metal layer undergoes silicidation reaction with the first source/drain layer 1007 to form silicide at the bottom surface of the first source/drain layer 1007. After that, the remaining metal layer which has not reacted may be removed. In this way, the subsequently formed bit lines 1029 may be in contact with the first source/drain layer 1007 via the silicide so that the contact resistance can be reduced.

Figure 13A:
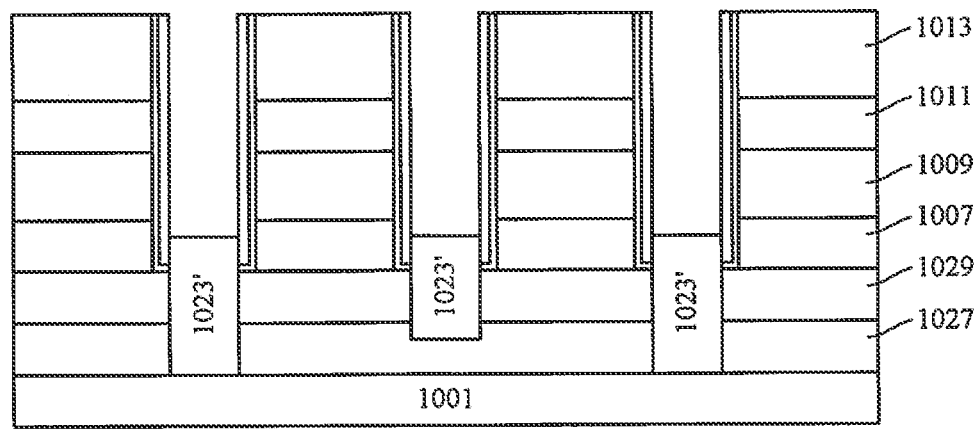
Figure 13B:
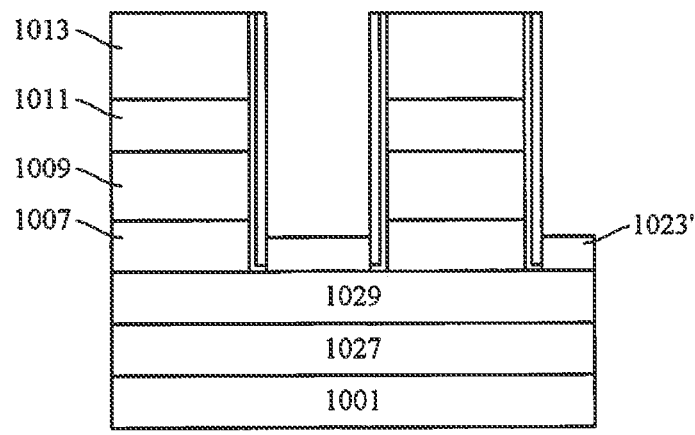
Figure 14A:
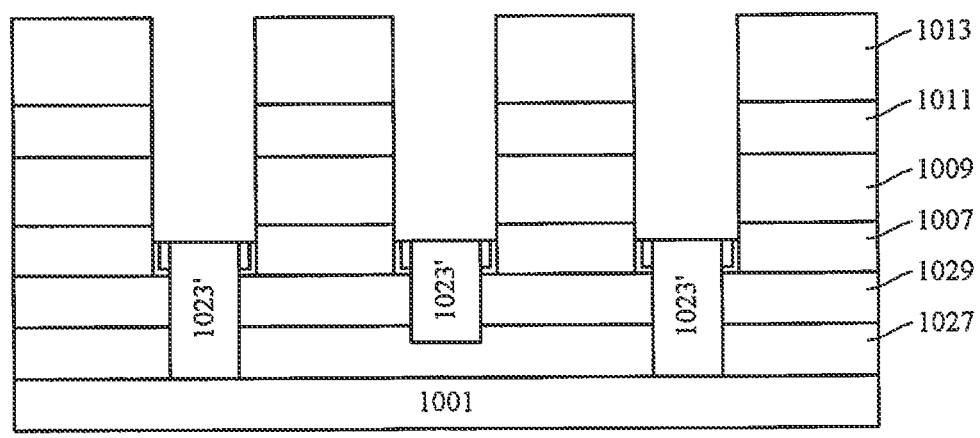
Figure 14B:
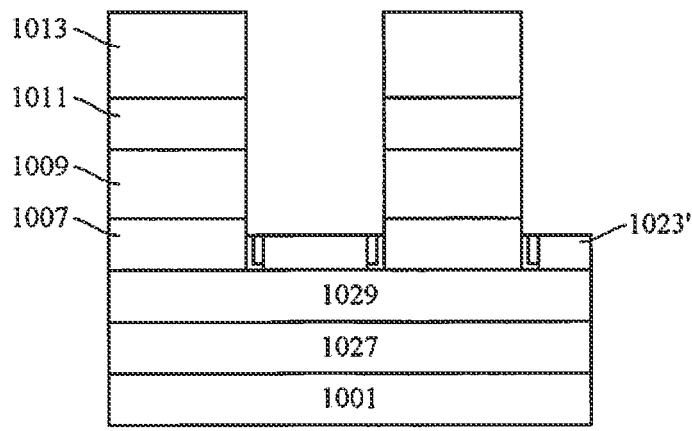

In order to ensure the electrical isolation between the bit lines 1029, dielectric may be supplemented at the second cuts (M3) described above. The dielectric may have the same material such as oxide as that of the hold layer 1023. In addition, sidewalls of the active regions, particularly the channel layer 1009, need to be exposed for the subsequent manufacturing of the device. For example, as shown in FIGS. 13A and 13B (FIGS. 13A and 13B are sectional views along line AA' and line BB' in FIG. 12A respectively), oxide may be deposited on the structure shown in FIGS. 12A, 12B and 12C and the oxide may be etched back to form an isolation layer 1023' between the bit lines 1029. The isolation layer 1023' may has its top surface at a level, on one hand, lower than a bottom surface of the channel layer 1009 for subsequent processing of the channel layer 1009; and on the other hand, higher than a bottom surface of the first source/drain layer 1007 so as to ensure the electrical isolation between the bit lines 1029. Then, as shown in FIGS. 14A and 14B, the protection layer 1019 and the oxide layer 1017 may be selectively etched to remove exposed portions thereof, so as to expose the sidewalls of the active regions, particularly the channel layer 1009. In this example, when the protection layer 1019 of nitride is removed, the hard mask layer 1013 of nitride may remain due to its large thickness.

After that, the manufacture of the vertical devices can be continued.

Figure 15A:
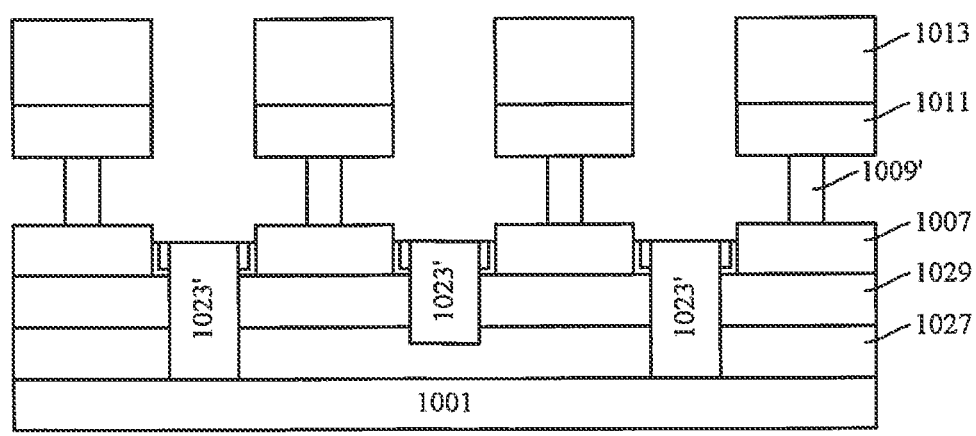
Figure 15B:
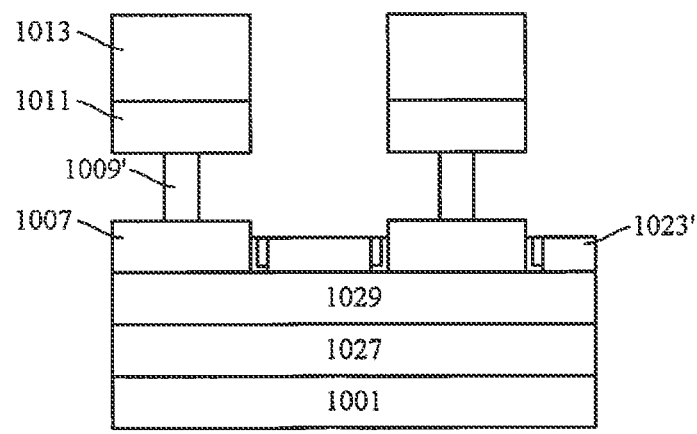

As shown in FIGS. 15A and 15B, the periphery of the channel layer 1009 may be recessed with respect to the peripheries of the first source/drain layer 1007 and the second source/drain layer 1011 (in this example, in a lateral direction substantially parallel to the substrate surface.) For example, this may be done by further selectively etching the channel layer 1009 with respect to the first source/drain layer 1007 and the second source/drain layer 1011, by for example, Atomic Layer Etching (ALE) or digital etching. The etched channel layer 1009' may have a diameter of about 5-50 nm or about ⅔ of a thickness of the channel layer 1009', resulting in nanowires.

Figure 16A:
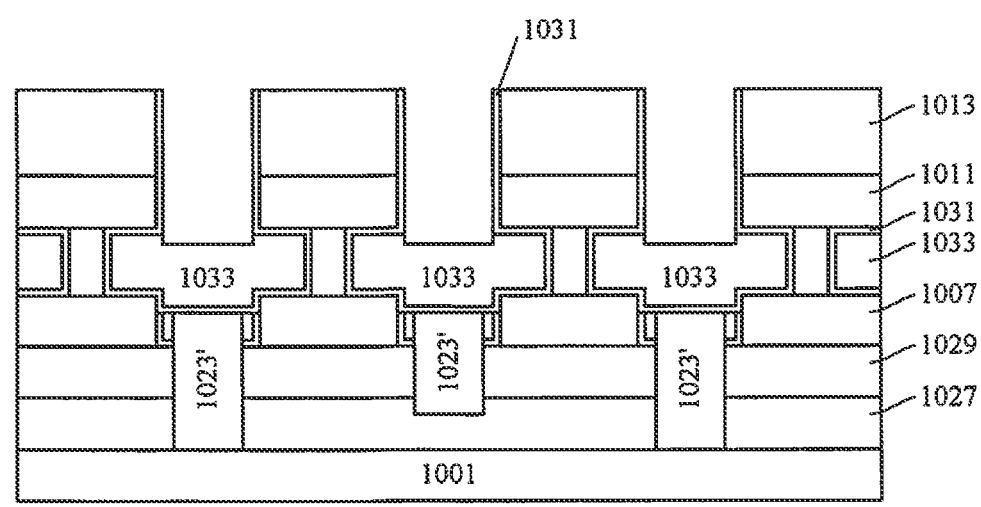
Figure 16B:
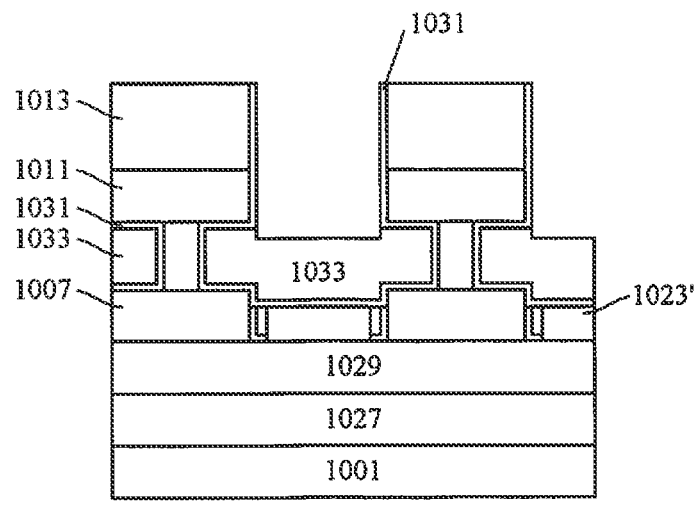

Gate stacks may be formed around peripheries of the channel layer 1009' in the respective active regions. For example, as shown in FIGS. 16A and 16B, a gate dielectric layer 1031 and a gate conductor layer 1033 may be deposited on the structure shown in FIGS. 15A and 15B in sequence, and the deposited gate conductor layer 1033 (and optionally the gate dielectric layer 1031) may be subject to CMP and then etched back, so that a portion thereof which is located outside a recess formed by the periphery of the channel layer 1009' with respect to the peripheries of the first source/drain layer 1007 and the second source/drain layer 1011 has its top surface at a level not higher and preferably lower than a top surface of the channel layer 1009'. For example, the gate dielectric layer 1031 may include high-K gate dielectric such as $HfO_2$ with a thickness of about 1-5 nm. The gate conductor layer 1033 may include a metal gate conductor. In addition, a work function adjustment layer may further be formed between the gate dielectric layer 1031 and the gate conductor layer 1033. An interfacial layer of, for example, oxide, may be formed before the formation of the gate dielectric layer 1031. Due to the presence of the recess, the gate stacks may be self-aligned with the channel layer 1009' and thus overlap with an entire height of the channel layer 1009'.

According to another embodiment, the gate stacks may form a storage configuration. For example, a floating gate layer or a charge trapping layer or a ferro-electric material or the like may be deposited before the deposition of the gate conductor layer 1033. In this case, after the gate conductor layer 1033 is etched back so that a portion thereof which is located outside the recess formed by the periphery of the channel layer 1009' with respect to the peripheries of the first source/drain layer 1007 and the second source/drain layer 1011 has its top surface at a level not higher and preferably lower than the top surface of the channel layer 1009', portions of the floating gate layer or the charge trapping layer or the ferro-electric material on the sidewalls may be removed, thereby leaving more space for the word lines or reducing the resistance of the word lines.

Figure 17A:
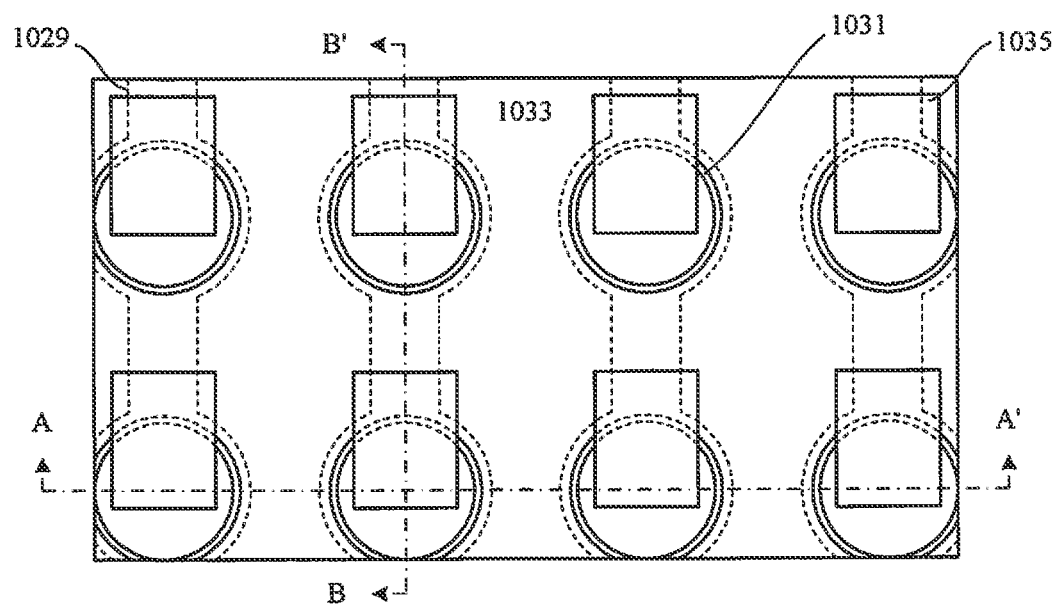
Figure 17B:
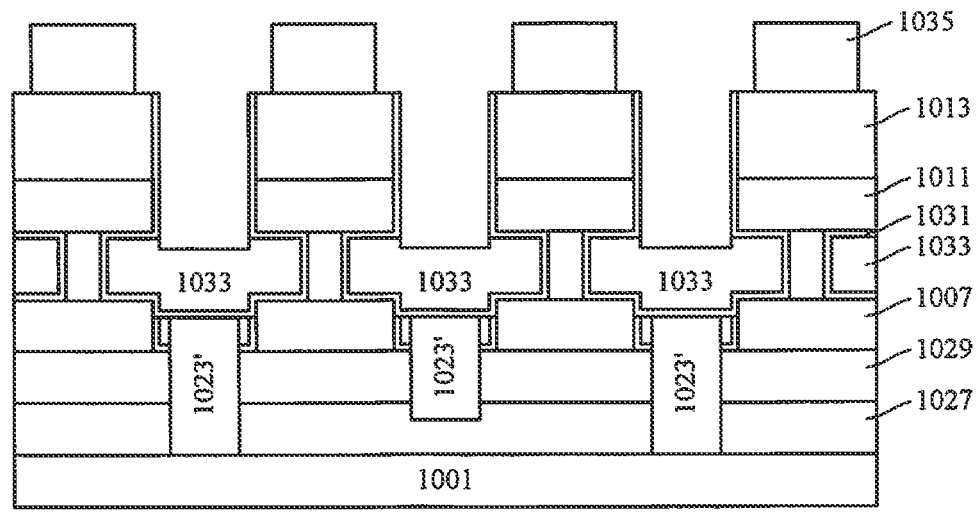
Figure 17C:
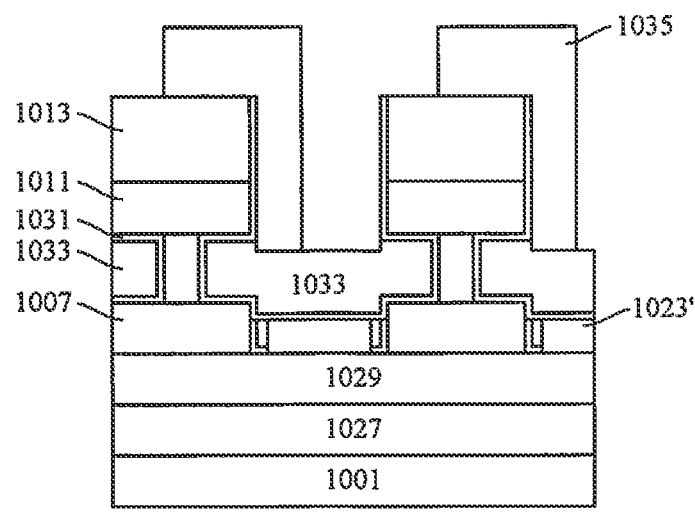

Next, the gate stacks may be adjusted in shape to facilitate subsequent interconnect. For example, as shown in FIGS. 17A, 17B and 17C (FIG. 17A is a top view, FIG. 17B is a sectional view taken along line AA' in FIG. 17A, and FIG. 17C is a sectional view taken along line BB' in FIG. 17A), photoresist 1035 may be formed on the structure shown in FIGS. 16A and 16B. The photoresist 1035 is patterned by, for example, photolithography into an array corresponding to the array of active regions, i.e., including portions located above the respective active regions, and the respective portions extend from the respective active regions to one side (upper side in the figure).

Figure 18A:
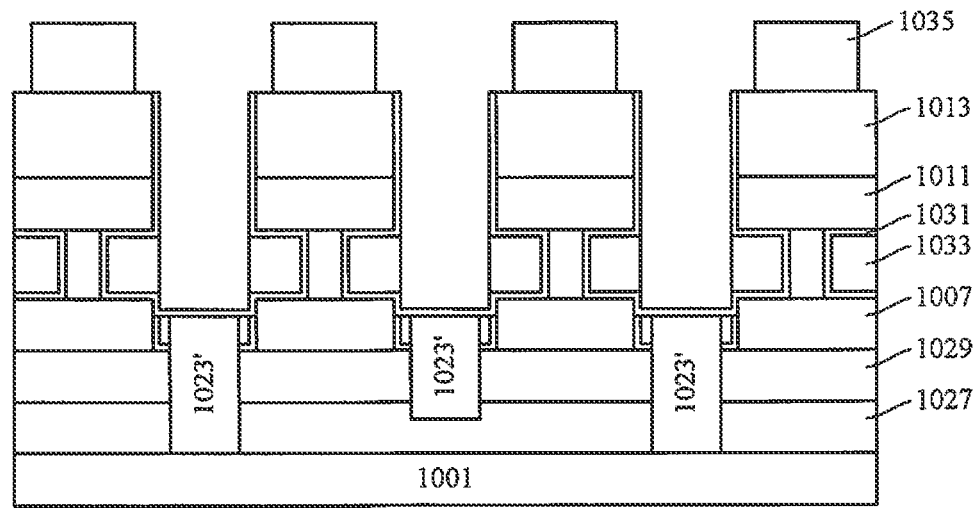
Figure 18B:
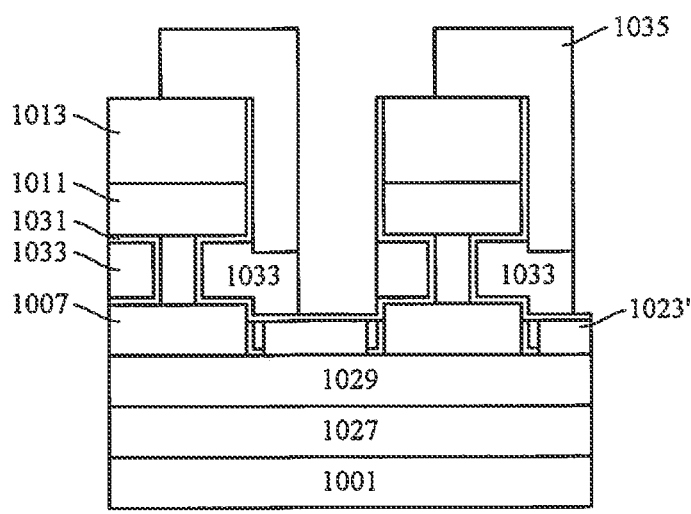

Then, as shown in FIGS. 18A and 18B (FIGS. 18A and 18B are sectional views along lines AA' and BB' in FIG. 17A respectively), the gate conductor layer 1033 may be selectively etched by, for example, RIE (for example, in a direction substantially perpendicular to the substrate surface) using the photoresist 1035 as a mask. Thus, the gate conductor layer 1033 is cut off between the respective rows and columns of active regions (i.e., the gate stacks of the respective vertical devices are separated). Moreover, in addition to a portion of the gate conductor layer 1017 remaining within the recess, there is also a portion of the gate conductor layer 1017 protruding from the recess for subsequent electrical connection with the word lines. According to another embodiment, the gate dielectric layer 1031 may further be selectively etched by, for example, RIE. After that, the photoresist 1035 may be removed. In embodiments where the gate stacks have a storage configuration, any conductive layer in the floating gate layer or the storage configuration needs to be cut off (i.e., floating gate layers or conductive layers in the gate stacks of the respective vertical devices are separated). The charge trapping layer or the ferro-electric material in the storage configuration may be cut off to reduce crosstalk between the cell devices.

After that, word lines electrically connected to the respective gate stacks may be formed. According to an embodiment of the present disclosure, the word lines may also be manufactured in a self-aligned manner. The word lines may be formed at positions between the respective rows of active regions and extend in a direction of the row.

Figure 19A:
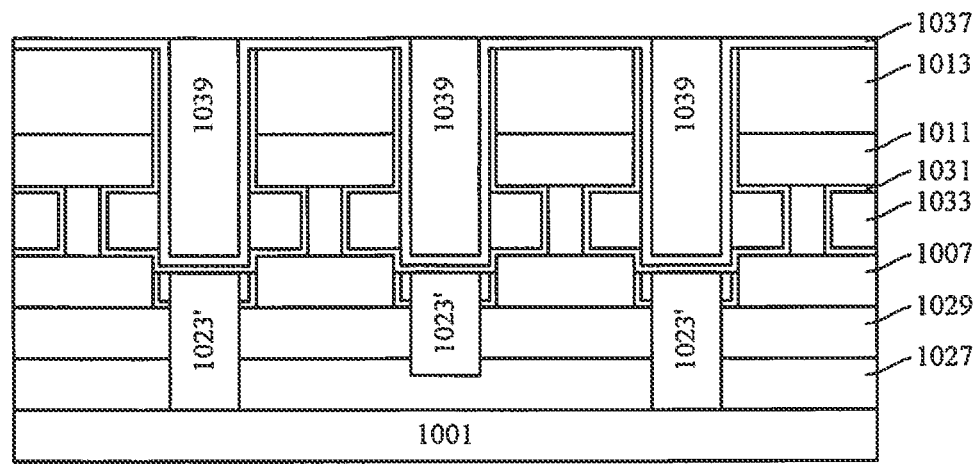
Figure 19B:
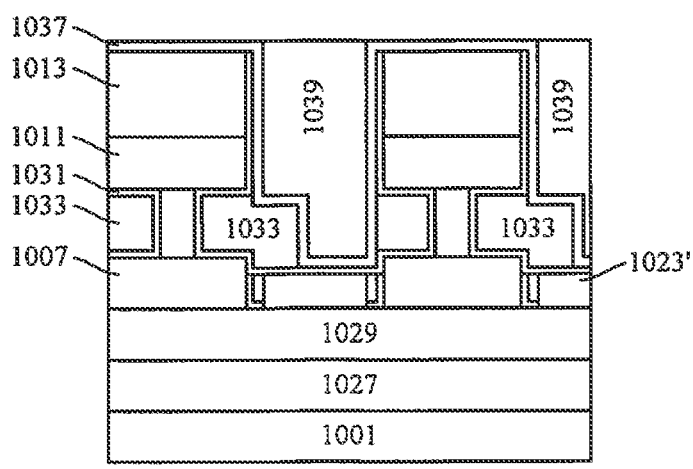

As shown in FIGS. 19A and 19B, a dielectric layer 1039 may be filled in the gaps in the stack for electrical isolation. For example, oxide may be deposited on the structure shown in FIGS. 18A and 18B, and the oxide may be planarized by, for example, CMP to fill the dielectric layer 1039. In addition, a liner 1037 may be formed firstly before filling the dielectric layer 1039 for purposes of, for example, protection and etching stop. For example, the liner 1037 may include nitride and may be relatively thin so that it may be substantially conformally formed. The CMP performed on the dielectric layer 1039 may be stopped at the liner 1037.

Figure 20A:
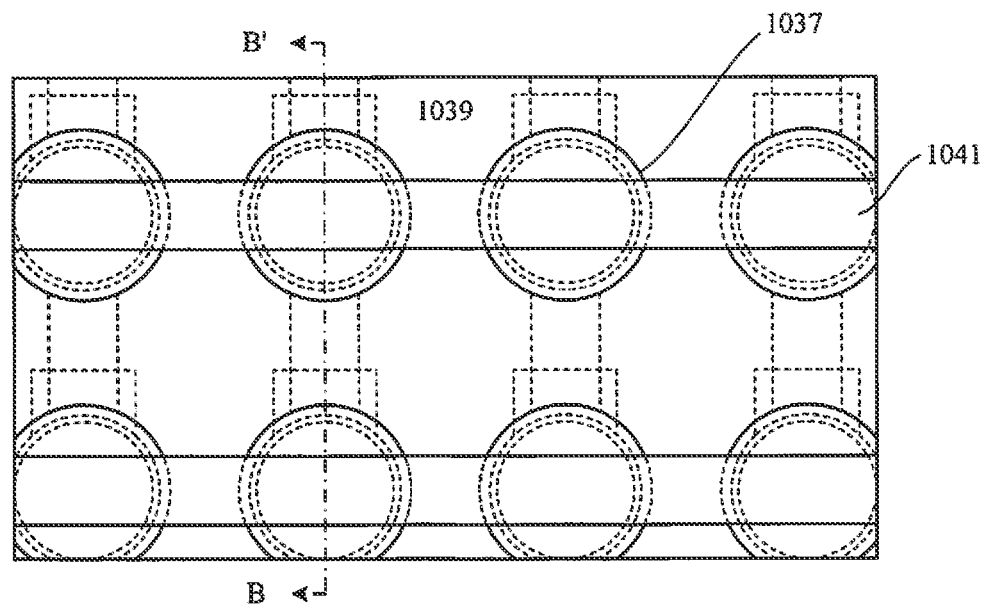
Figure 20B:
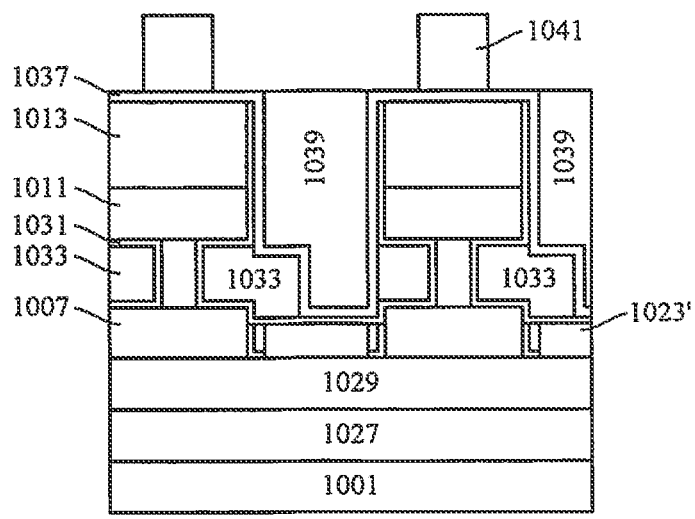

Then, positions where the word lines are to be formed may be defined in the dielectric layer 1039. As shown in FIGS. 20A and 20B (FIG. 20A is a top view, and FIG. 20B is a sectional view taken along line BB' in FIG. 20A), a mask layer 1041 of, for example, photoresist may be formed on the structure shown in FIGS. 19A and 19B, and may be patterned by, for example, photolithography to extend in the row direction on the respective rows of active regions. That is, the mask layer 1041 may include a plurality of strip patterns, each of which connects the respective active regions in a corresponding row and may exposes a part of peripheries of the respective active regions in the row on one side or both sides (upper side and/or lower side in the figure).

Figure 21A:
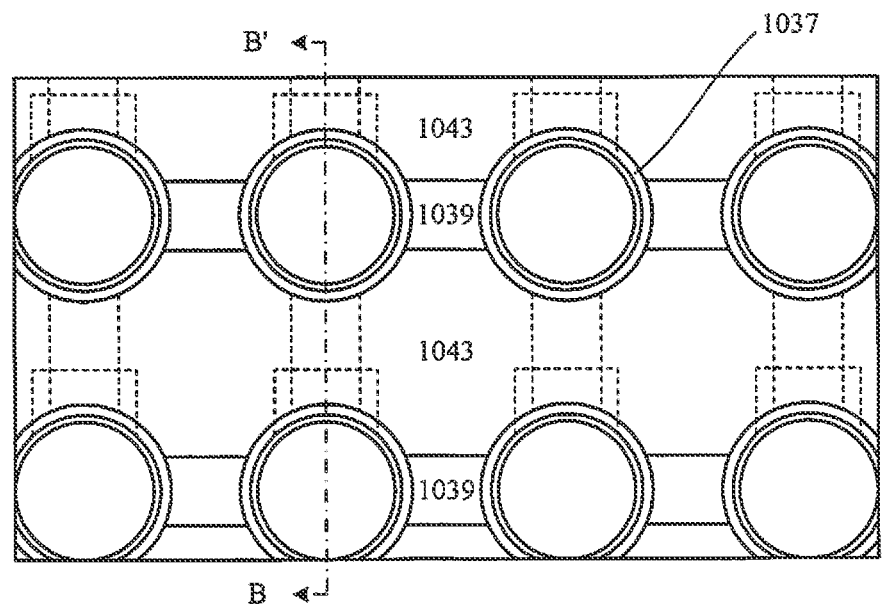
Figure 21B:
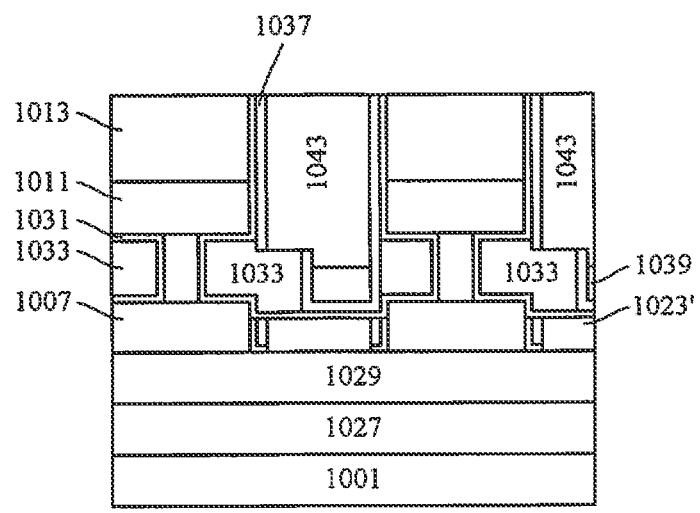

As shown in FIGS. 21A and 21B (FIG. 21A is a top view, and FIG. 21B is a sectional view taken along line BB' in FIG. 21A), the dielectric layer 1039 may be selectively etched by, for example, RIE (for example, in a direction substantially perpendicular to the substrate surface) using the mask layer 1041 as a mask. In order to ensure good electrical isolation from the underlying buried bit lines, a portion (for example, a lower portion) of the dielectric layer 1039 may remain here, i.e., the dielectric layer 1039 is not completely etched. In this way, strip-shaped spaces extending in the row direction are left between the respective rows of active regions, the dielectric layer 1039 isolates the strip-shaped spaces from each other, and the gate stacks protrude towards positions below the spaces. After that, the mask layer 1041 may be removed.

These spaces may be used to form the word lines therein. In order to facilitate the electrical connection between the gate conductor layer 1033 and the subsequently formed word lines, the liner 1037 may be selectively etched by, for example, RIE so that a the gate conductor layer 1033 can have its surface at least partially exposed. The RIE may be performed in a direction substantially perpendicular to the substrate surface. Thus, a portion of the liner 1037 which extends horizontally may be removed and a portion of the liner 1037 which extends vertically may remain. Then, at least a top surface of the gate conductor layer 1033 is exposed at the bottom of the spaces. Word lines 1043 may then be formed by filling the spaces with a conductive material, for example, metal such as W or copper (Cu) or the like. For example, the conductive material may be deposited and planarized by, for example, CMP (which may be stopped at the hard mask layer 1013) to form the word lines in the spaces. It can be seen that the word lines 1043 may be self-aligned between the respective rows, without using a mask.

After that, various contacts of the device may be formed.

Figure 22A:
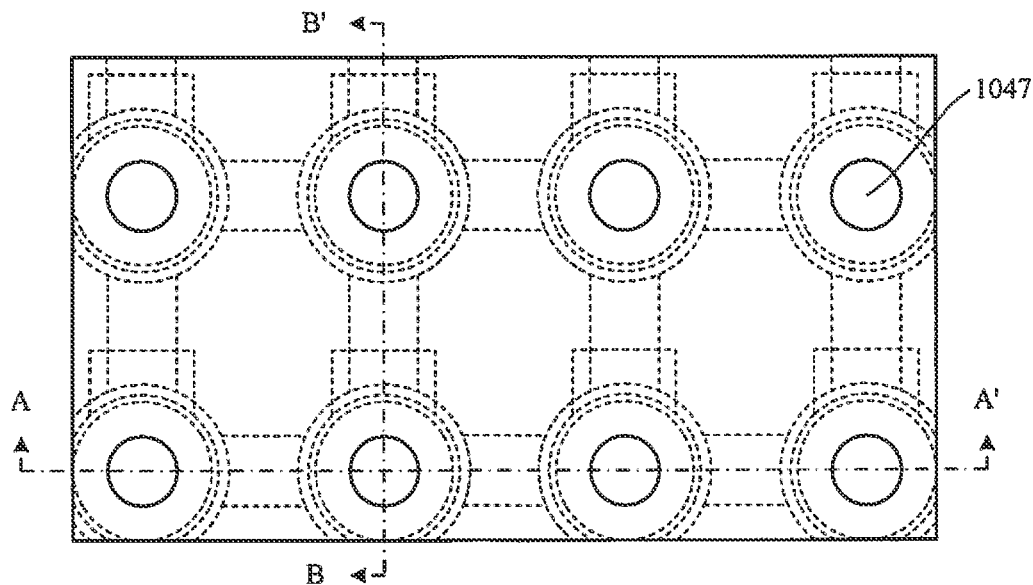
Figure 22B:
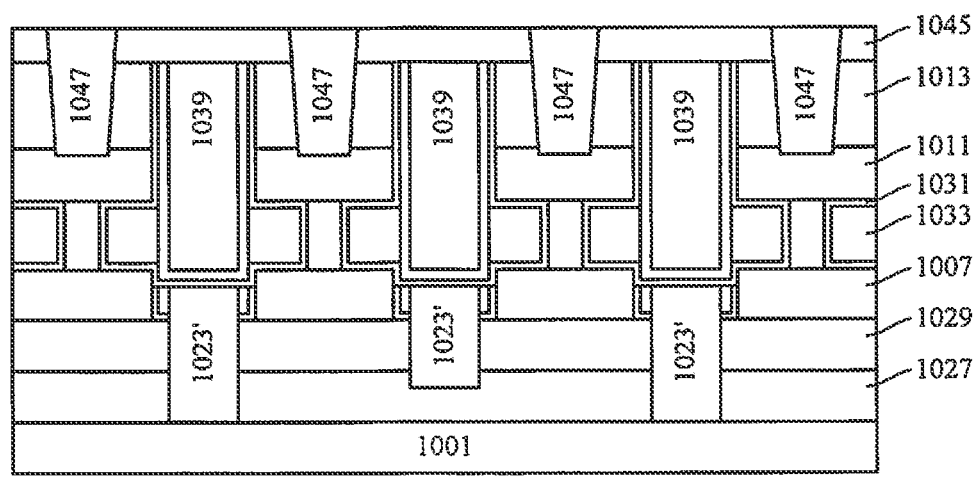
Figure 22C:
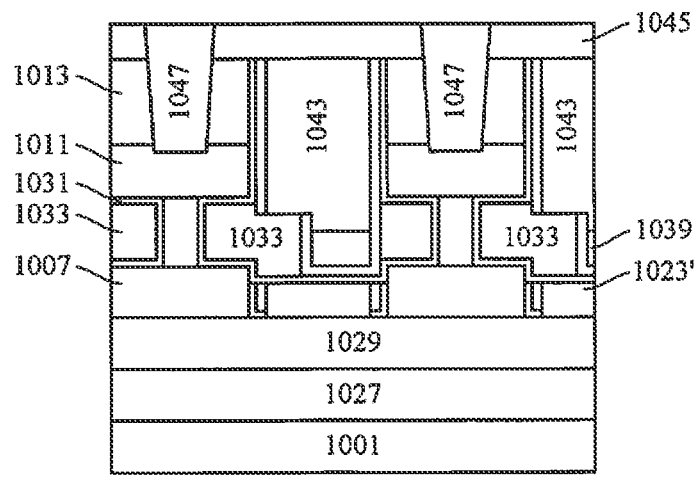

For example, as shown in FIGS. 22A, 22B and 22C (FIG. 22A is a top view, FIG. 22B is a sectional view taken along line AA' in FIG. 22A, and FIG. 22C is a sectional view taken along line BB' in FIG. 22A), an interlayer dielectric layer 1045 may be formed on the structure shown in FIGS. 21A and 21B. For example, nitride may be deposited and planarized by, for example, CMP to form the interlayer dielectric layer 1045. In the interlayer dielectric layer 1045, electrical contacts 1047 to the second source/drain layer 1011 may be formed. These contacts may be formed by etching holes in the interlayer dielectric layer 1045 and the hard mask layer 1013 and filling the holes with a conductive material, for example, metal such as W or the like. A diffusion barrier layer of, for example, TiN may also be formed on sidewalls of the holes before filling the metal.

Figure 23A:
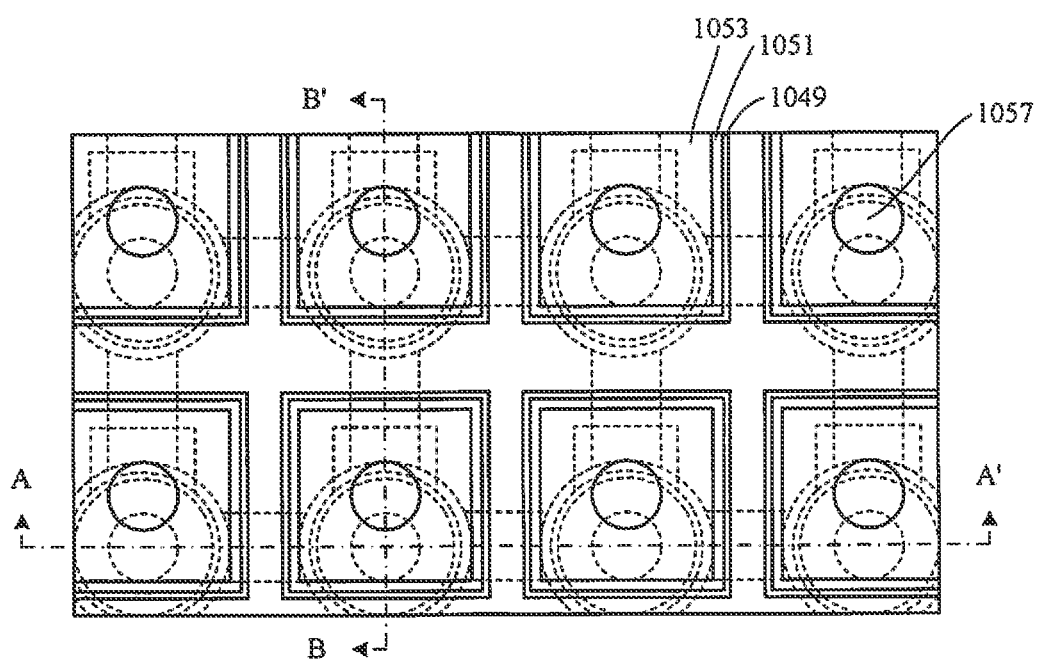
Figure 23B:
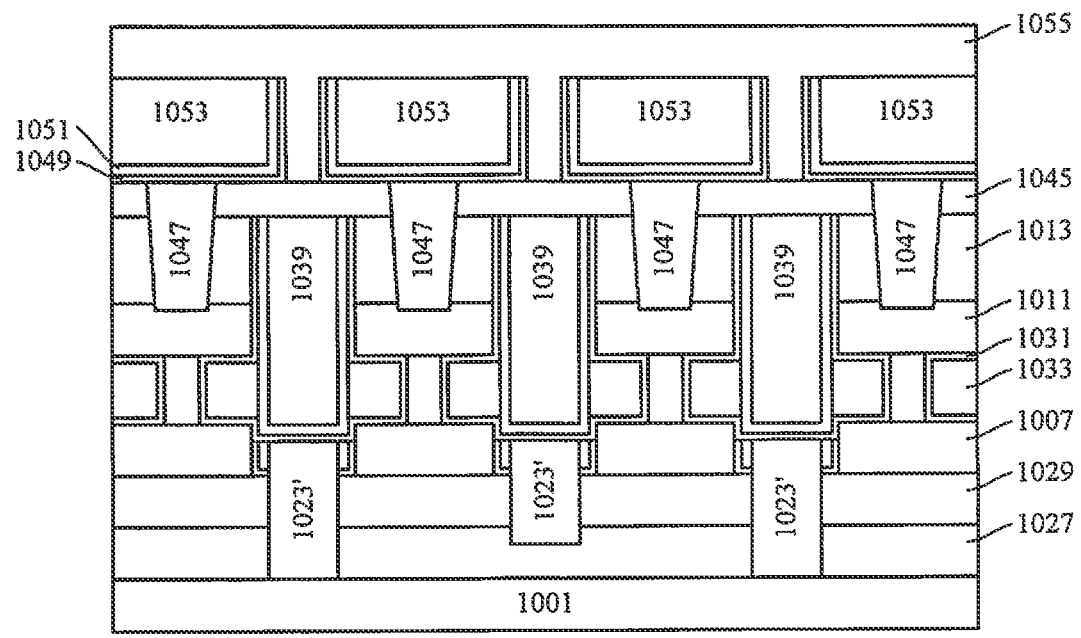
Figure 23C:
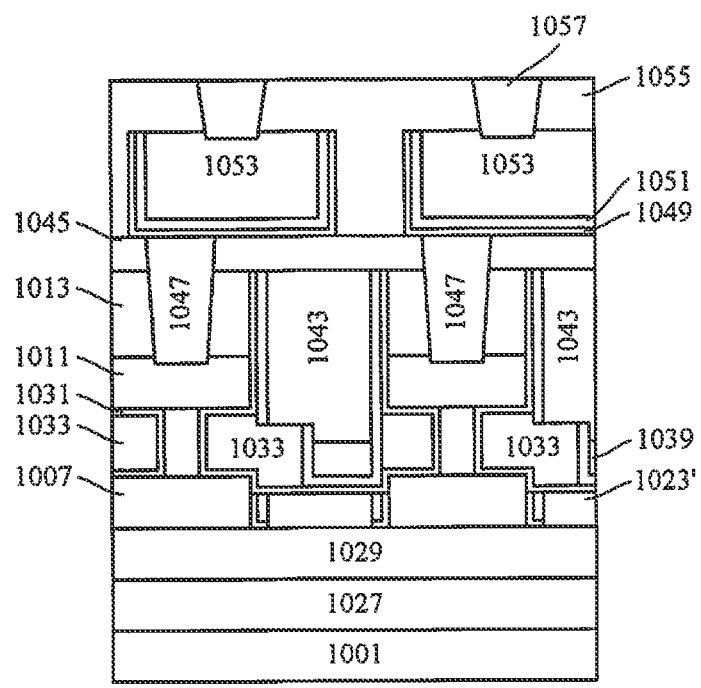

In an example of forming a 1T1C configuration, storage elements such as capacitors may also be formed. For example, as shown in FIGS. 23A, 23B and 23C (FIG. 23A is a top view, FIG. 23B is a sectional view along line AA' in FIG. 23A, and FIG. 23C is a sectional view along line BB' in FIG. 22A), an interlayer dielectric layer of, for example, oxide with a first thickness may be formed on the interlayer dielectric layer 1045, and storage elements corresponding to the respective vertical devices may be formed in the interlayer dielectric layer with the first thickness. For example, holes corresponding to the respective vertical devices may be etched, and a first plate layer 1049, a dielectric layer 1051, and a second plate layer 1053 may be filled in the holes in sequence to form capacitors as the storage elements. For example, the first plate layer 1049 and the second plate layer 1053 may include metal, and the dielectric layer 1052 may include high-k dielectric. Each of the capacitors may be electrically connected to the upper source/drain region of a corresponding one of the vertical devices through a corresponding one the contacts 1047.

After that, an interlayer dielectric layer of, for example, oxide with a second thickness may also be formed. The interlayer dielectric layer with the second thickness and the interlayer dielectric layer with the first thickness are shown together as 1055. It is to be noted here that in the top view of FIG. 23A, the interlayer dielectric layer 1055 is not shown for the sake of clarity. In the interlayer dielectric layer with the second thickness, electrical contacts 1057 to the second plate layer 1053 of the respective capacitors may be formed.

The semiconductor memory devices according to the embodiments of the present disclosure are applicable to various electronic devices. For example, the electronic device may include such a memory device and a processor, and the processor may read/write data from/to the semiconductor memory device. The electronic device may further comprise components such as a display and a wireless transceiver or the like operatively coupled to the processor. Such an electronic device may be, for example, a smart phone, a computer, a tablet Personal Computer (PC), an artificial intelligence, a wearable device, a mobile power supply, or the like.

In the above descriptions, techniques such as patterning, etching or the like of various layers are not described in detail. It is to be understood by those skilled in the art that various technical measures may be utilized to form the layers, regions or the like in desired shapes. Further, in order to form the same structure, those skilled in the art can devise processes not completely the same as those described above. Although various embodiments are described respectively above, it does not mean that measures in various embodiments cannot be used in combination advantageously.

The embodiments of the present disclosure are described above. However, those embodiments are provided only for illustrative purpose, rather than limiting the scope of the present disclosure. The scope of the present disclosure is defined by the attached claims as well as equivalents thereof. Those skilled in the art can make various alternations and modifications without departing from the scope of the present disclosure, which all fall within the scope of the present disclosure.

I claim:

1. A method of manufacturing a semiconductor memory device, comprising:
    providing a stack of a sacrificial layer, a first source/drain layer, a channel layer, and a second source/drain layer on a substrate;
    defining a plurality of pillar-shaped active regions arranged in rows and columns in the first source/drain layer, the channel layer, and the second source/drain layer;
    after defining the plurality of pillar-shaped active regions, removing the sacrificial layer and forming a plurality of bit lines extending below the respective columns of active regions in a space left by the removal of the sacrificial layer;
    forming gate stacks around peripheries of the channel layer in the respective active regions; and
    forming a plurality of word lines between the respective rows of active regions, wherein each of the word lines is electrically connected to the gate stacks of the respective memory cells in a corresponding one of the rows.

2. The method according to claim 1, further comprising:
    forming a dielectric layer to cover the stack and the word lines; and
    forming, on the dielectric layer, storage elements electrically connected to the second source/drain layer in the respective active regions.

3. The method according to claim 1, further comprising:
    forming another sacrificial layer on the substrate, wherein the stack is provided on the other sacrificial layer, and wherein, the method further comprises, after the defining of the active regions and before the removing of the sacrificial layer, removing the other sacrificial layer, and forming an insulating layer in a space left by the removal of the other sacrificial layer.

4. The method according to claim 1, wherein forming the bit lines comprises:
by taking every two adjacent columns as a group, cutting off the sacrificial layer at a position between the two active region columns in each of the groups, so as to form a series of cuts extending along a direction of the column in the sacrificial layer;
forming on the substrate a hold layer to fill gaps in the stack;
patterning the hold layer to expose the sacrificial layer between the respective groups;
selectively etching the sacrificial layer to remove the sacrificial layer;
filling a conductive material in the space left by the removal of the sacrificial layer; and
selectively etching the conductive material using the hold layer as a mask to cut off the conductive material, so as to form the bit lines.

5. The method according to claim 4, wherein at least one of the cutting of the sacrificial layer and the cutting of the conductive material is performed in a self-aligned manner with respect to the active regions.

6. The method according to claim 5, wherein cutting off the sacrificial layer comprises:
forming a mask layer on the stack, wherein the mask layer comprises a plurality of first openings, each of which exposes a position between the two columns in a corresponding one of the active region groups, and exposes parts of peripheries of the respective active regions in each of the two columns in the corresponding group which face the other column in the group; and
selectively etching the sacrificial layer using the mask layer and the active regions as a mask to cut off the sacrificial layer.

7. The method according to claim 6, wherein the mask layer further comprises a plurality of second openings, each of which exposes a position between the respective groups.

8. The method according to claim 7, wherein the mask layer comprises strip patterns extending above the respective columns of active regions, and each of the strip patterns exposes parts of peripheries of the respective active regions in the corresponding column on opposite sides.

9. The method according claim 5, wherein the hold layer is patterned to further expose parts of the peripheries of the respective active regions in each of the groups which face an adjacent one of the groups, and cutting off the conductive material comprises selectively etching the conductive material using the hold layer and the active regions as a mask.

10. The method according to claim 4, further comprising:
depositing a dielectric on the substrate to fill gaps between the bit lines and in the stack; and
etching back the hold layer and the dielectric layer so that the etched-back hold layer and dielectric layer electrically isolate the respective bit lines on the one hand and expose the channel layer on the other hand.

11. The method according to claim 1, further comprising:
selectively etching the channel layer so that the periphery of the channel layer is recessed with respect to peripheries of the first and second source/drain layers.

12. The method according to claim 11, wherein the forming gate stacks comprises:
depositing a gate dielectric layer and a gate conductor layer in sequence; and
selectively etching the gate conductor layer to make a top surface thereof lower than a top surface of the channel layer.

13. The method according to claim 1, wherein the gate stacks are formed to have respective extension portions extending in a direction away from the respective active regions, wherein the extension portions of the respective gate stacks extend towards substantially the same direction.

14. The method according to claim 13, wherein forming the word lines comprises:
forming on the substrate an isolation layer having portions extending between the respective active regions in each of the active region rows; and
forming the word lines between the respective active region rows and between the portions of the isolation layer.

15. The method according to claim 1, wherein providing the stack comprises providing the stack by epitaxial growth.

* * * * *